United States Patent [19]
Saitoh et al.

[11] Patent Number: 5,663,589
[45] Date of Patent: Sep. 2, 1997

[54] CURRENT REGULATING SEMICONDUCTOR INTEGRATED CIRCUIT DEVICE AND FABRICATION METHOD OF THE SAME

[75] Inventors: Yutaka Saitoh; Jun Osanai; Yoshikazu Kojima; Kazutoshi Ishii, all of Tokyo, Japan

[73] Assignee: Seiko Instruments Inc., Japan

[21] Appl. No.: 314,140

[22] Filed: Sep. 28, 1994

[30] Foreign Application Priority Data

Sep. 29, 1993 [JP] Japan ................. 5-243221

[51] Int. Cl.$^6$ ............... H01L 29/76; H01L 21/04
[52] U.S. Cl. ............. 257/401; 257/261; 257/268; 257/341; 257/348; 257/350; 257/368; 257/390; 257/391; 257/393; 257/402; 257/508; 257/907; 257/910; 438/237; 438/281; 438/128
[58] Field of Search ................. 257/390, 391, 257/368, 393, 508, 907, 261, 268, 341, 348, 350, 402, 401, 773, 910; 437/913

[56] References Cited

U.S. PATENT DOCUMENTS 5,089,862  2/1992  Warner et al. ................. 257/24

*Primary Examiner*—Edward Wojciechowicz
*Attorney, Agent, or Firm*—Adams & Wilks

[57] ABSTRACT

A semiconductor integrated device having a current regulating diode may be substantially reduced in size and improved in performance by forming the current regulating diode of a plurality of MOS transistors each having a gate, a drain region, and a source region formed in a semiconductor substrate, the source regions and the substrate regions being electrically coupled to each other, the drain regions of at least two of the MOS transistors being electrically coupled, and the source regions of each of the MOS transistors being electrically coupled, the coupled drain regions, the coupled source regions, and the coupled gates forming a drain terminal, a source terminal and a gate terminal, respectively. In order to set a desired regulated current, selected coupling lines in the current regulating diode may be cut. This may be accomplished, for example, by measuring a first current which flows in the drain terminal while applying a first voltage to the gate terminal and a second voltage to the drain terminal relative to an electric potential of the source terminal, then measuring a second current which flows in the drain terminal while applying a third voltage to the gate terminal and the second voltage to the drain terminal relative to an electric potential of the source terminal. In order to achieve the desired current characteristic, selected conductive lines between coupled drains or between coupled sources are then cut.

43 Claims, 36 Drawing Sheets

FIG. 8

| $V_{TND}$ | $I_P/W$ | $I_P$ (W=5555μm) | $I_P$ (W=4400+3750μm) | |
|---|---|---|---|---|
| −0.75 Min. | 1.2μA | 7mA | ≈ 10mA | 300μA |
| −0.90 Typ. | 1.8μA | 10mA | ≈ 14mA → 10mA | 370μA |
| −1.0 Max. | 2.4μA | 13mA | ≈ 19mA → 10mA | 560μA |

$V_{SB} \doteq 30^V$
SNAPBACK VOLTAGE

FIG. 41
FIG. 42
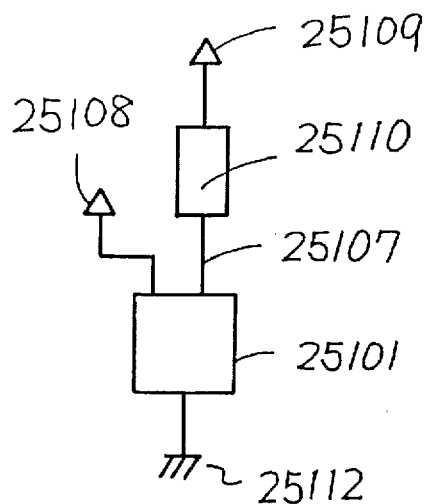
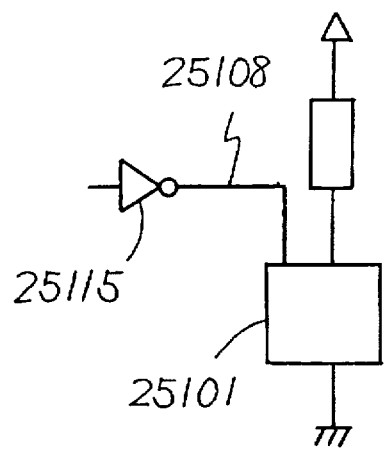
FIG. 43
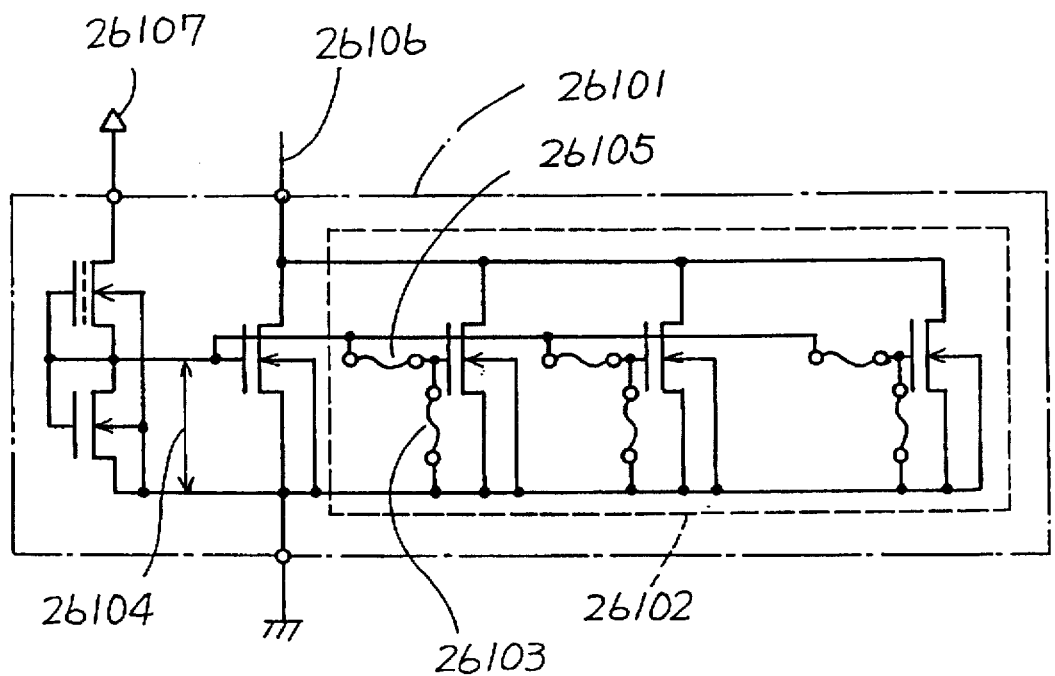

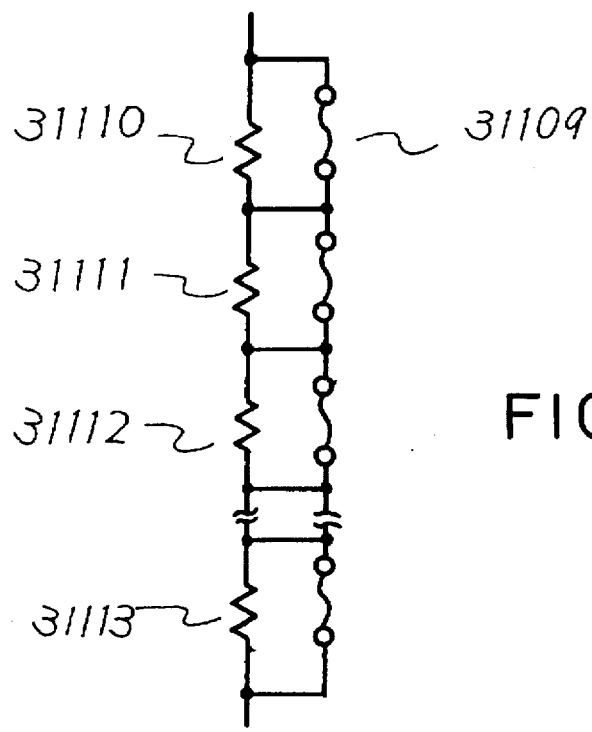
FIG. 50
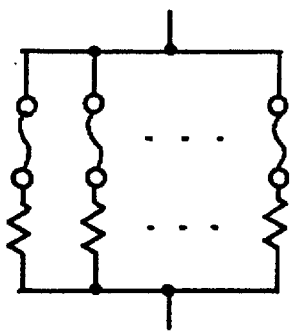
FIG. 51
FIG. 52
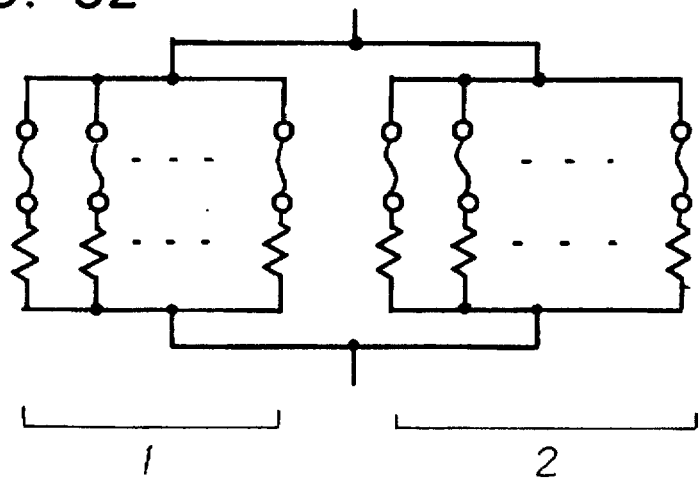

CURRENT REGULATING SEMICONDUCTOR INTEGRATED CIRCUIT DEVICE AND FABRICATION METHOD OF THE SAME

BACKGROUND OF THE INVENTION

1. Field of the Invention

The present invention relates to a construction and fabrication method of a semiconductor integrated circuit device used as a current regulating diode (Hereinafter referred to as a CRD) and more particularly to a construction and fabrication method for realizing suitable electrical characteristics as a current regulating diode of a depletion type (surface inversion type, normally-on type) N channel MOS (NMOS) transistor in which a gate, source and substrate are electrically connected (cabled).

2. Discussion of Related Art

FIG. 58 is an explanatory diagram for showing an electrical function of a prior art CRD for which a junction field effect transistor (hereinafter referred to as a JFET) is generally used. The JFET comprises a drain 18002, gate 18001 and source 18003, and the gate electrode 18001 is connected with the source electrode 18003.

FIG. 59 is an explanatory diagram for showing an electrical function of a CRD. An anode 18004 and cathode 18005 are included and arrow 18009 indicates a direction of current which becomes a regulated current.

FIG. 60 is an outside view of the prior art CRD. A CRD chip 18008 is built in a cylindrical glass mold 18007 type outer case (package) having a length of several mm and diameter of about 1 mm and a lead wire for electrode 18006 (referred to as an axial lead) is provided in both directions respectively as an anode electrode and cathode electrode.

Having the construction as described above, the prior art CRD has the following problems.

FIG. 61 is a graph showing a current-voltage characteristic of the prior art JFET CRD. As seen from the graph, the lowest voltage VL for obtaining a desired regulated current value is a voltage value of more than 5 V. The VL rises up to 7 V or 10 V depending on the current value. This is because the JFET is used and the pinch off voltage of the channel is high. Such high voltage cannot be used for circuits having a power voltage of 5 V, 3 V or 1.5 V which are standards of current electronic circuits. Contrary to that, because it is a JFET and allows one to considerably raise a breakdown voltage VB to about 100 V, an operating maximum voltage VH may be easily set at 24 V or 26 V. However, because the JFET CRD basically operates as a bipolar element (minority carrier element), a time response on the OFF side (accumulation of minority carriers) in response to a fluctuation of voltage is very slow and hence it conventionally causes many noises.

Further, concerning a matter of production, while it is fabricated targeting for a certain value (rating) of IP (a rating of a current regulating diode as a product is a value when it is supplied by compensating like 10 mA±10% for example. IP denotes a value of regulated current at a standard voltage value VP and VL denotes the lowest voltage which falls within its ±range), there is a problem that IP of the finished product actually fluctuates by about ±20%. Accordingly, because they are selectively shipped or a variation of products having different current values are created in the fabrication and are lined up in reality, their yield (ratio of good products) is bad, their stock increases and their production cost becomes very high.

On the other hand, a CRD made from a depletion type N channel MOS transistor in which a gate, source and electrode are electrically connected undergoes more fluctuation in the fabrication. The fluctuation exceeds ±30% and it increases further when VH is increased. This is because the fluctuation of the depletion state (threshold voltage: VTH) of the channel increases by all means in the fabrication.

Further, while VL can be set low, VH can be set at 7 V or 10 V at most. Although the standard power voltage of electronic circuits has come to be less than 5 V, a 12 V system or 24 V system is still used as a standard for a driving system requiring a higher power and a CRD for such use requires about 24 V of maximum voltage VH. Here, a thickness of gate insulating film (gate TOX) has to be increased in order to increase VH. Then a disadvantage that VTH fluctuates further is brought about. The greater the thickness of the gate insulating film, the greater the fluctuation becomes. In addition to that, when the gate insulating film thickness is increased, a trans-conductance (gm) of the MOS transistor drops and a channel width or so-called W width for obtaining a necessary drain current ID, i.e., IP, has to be widened, hence increasing the chip size. Thus the prior art CRD has disadvantages that its yield is bad, chip size is large and its production cost is high.

SUMMARY OF THE INVENTION

In order to solve the aforementioned problems, the following means have been adopted in the present invention.

As first means, such trimming means that a redundancy is given to a circuit for controlling a current value of a circuit element of current path or a current value of a current path and a selection is made as necessary has been adopted in order to obtain a regulated current.

As second means, a MOS transistor is used for the current path.

As third means, there are provided a first drain region having a channel of a first W width which corresponds to an IP which is below a desired IP (called a first drain region) and a second drain region having a plurality of channels in which there are plurality of types of W widths of the channels from which necessary ones are selected and connected to the first drain region in parallel. Here those plurality of types of W widths take a dimensional ration of $X^n$. Here X is set as a numerical value greater than 1.0 and n is set as a sequence of numbers corresponding to the number of types of the W widths starting from zero. The number of channel widths provided in the second drain region may each be called a bit. Normally the integer n is selected from an arithmetical sequence of numbers such as n=0, 1, 2, 3, 4, . . . when X=2 to 4 and it may be an intermediate number. That is, it is an exponential ratio.

As fourth means which is related to the second and third arrangements, connecting wires for selecting the second drain width are formed by poly-silicon (hereinafter referred to as a poly-silicon fuse or fuses).

As fifth means which is related to the fourth arrangement, a plurality of poly-silicon fuses are connected in parallel for one type of drain width.

As sixth means which is related to the third and fourth arrangements, a final protection film (SIN, silicon nitride film, called a passivation film) is removed on the polysilicon.

As seventh means which is related to the first and second arrangements, at least a drain (or source) takes so-called a DDD (double diffused drain having a N⁻ type layer).

As eighth means which is related to the seventh arrangement, impurities forming the N⁻ type layer in the DDD structure is also introduced in another P⁺ type layer on the surface of the same semiconductor substrate.

As ninth means which is related to the first and second arrangement, the P⁺ type layer on the surface of the semiconductor substrate for taking a substrate potential in the connection among the substrate, gate and source of the NMOS is formed once (not every time) in a plurality of times of repetition of pairs of drains. In addition to that, the substrate potential is taken around the periphery of the semiconductor integrated circuit device without interruption.

As tenth means, a CRD of semiconductor integrated circuit device is constructed by a depletion type (surface inverting type, normally-on type) N channel MOS transistor in which gate, source and substrate are electrically connected, a gate insulating film is set at less than 500 angstrom and channel length (L length) of the gate is set at more than 8 μm. When it is desired to reduce V TH of depletion of channel (it is a definition in unsaturated measurement and is referred to as a V TND) to less than VL=1.5 V for example, it is set at less than −0.9 V and to reduce it to less than VL=1.0 V, it is set at less than −0.8 V.

As 11-th means which is related to the second arrangement, a source and substrate are shared and third and fourth drains similar to the arrangement of the first and second drains are provided.

As 12-th means which is related to the first and second arrangements, a connecting hole to a common electrode metal (a portion of the insulating film layer on the surface of the semiconductor substrate selectively etched and removed: referred to as a contact hole) is connected in a flat shape in the connection of the gate and source of the NMOS.

As 13-th means which is related to the first and second arrangements, the contact hole to the common electrode metal is connected in a flat shape in the connection of the gate, source and substrate potential of the NMOS.

As 14-th means which is related to the first and second arrangements, an N⁺ type layer is connected to the drain and structuring a PN junction (diode) because it is an N type impurity region in contact with the P⁻ type substrate. At this time, a breakdown voltage of the diode is lower than a breakdown voltage at the gate end of the drain or snapback voltage of the NMOS and a concentration of the impurities (concentration of impurities in the N⁺ type layer and neighboring P± type layer) is set.

As 15-th means which is related to the first and second arrangements, the semiconductor substrate is composed of two layers consisting of a P⁻ type layer and P⁺ type layer. That is, the NMOS is formed on the substrate having a P⁻ type epitaxial growth layer on the P⁺ type layer. It may be formed by laminating them. Further, a cathode electrode is formed on the surface of the P⁺ type layer which is on the opposite side from the surface on which the NMOS is formed.

As 16-th means which is related to the 15-th means, a high fusion point metal silicide is used for the gate electrode and anode electrode.

As 17-th means, a transistor having an even deeper V TND value is connected in series.

As 18-th means, a function for turning ON/OFF the regulated current is provided.

As 19-th means, a reference voltage is provided and the MOS transistor in the current path is driven by that voltage.

As 20-th means which is related to the 19-th means, the selection of the drain width is made by the poly-silicon fuse connected to the gate electrode.

As 21-st means which is related to the 19-th and 20-th means, a separate power source (Vdd) terminal is provided for the reference voltage circuit.

As 22-nd means which is related to the second means, a poly-silicon resistance component is provided in series with the MOS transistor and a differential amplifier for controlling the MOS transistor by feeding back a potential between the MOS transistor and the resistance component is provided.

As 23-rd means which is related to the 21-st and 22-nd means, the trimming for regulating current is made not on the current regulating path but on the drain width of the transistor in the current regulating circuit section (drivability).

As 24-th means which is related to the 19-th to 23-rd means, a function for turning ON/OFF the regulated current is provided.

As 25-th means which is related to the first to 24-th means, the MOS transistor is caused to take a LOCOS (Local Oxidation of Silicon) drain structure (described later).

As 26-th means which is related to the first to 25-th means, an ONO structure (described later) is adopted for the structure of the gate insulating film of the MOS transistor.

As 27-th means which is related to the first to 26-th means, a thickness of the gate insulating film of the MOS transistor of at least the current regulating path is set in between 350 to 600 angstrom.

As 28-th means which is regulated to the first to 24-th means, a semiconductor integrated circuit device containing the CRD element is constructed.

As 29-th means which is related to a manufacturing method of the CRD of the semiconductor integrated circuit device, the processes of measuring IP under a certain condition, making an arithmetic operation, deciding the redundancy, deciding a connecting poly-silicon fuse having a redundancy to be selected and cutting the fuse not connected by laser light or the like (called a laser trimming or trimming) are provided in the pre-stage of inspection process in a semi-finished product state in a wafer state after finishing a wafer process in the final stage of the fabrication process.

The adoption of the aforementioned means allows the following operations to be achieved.

The adoption of the first means allows to realize a high precision (within ±5%) CRD.

The adoption of the second means allows a current regulating characteristic utilizing the saturated region of the MOS transistor.

The adoption of the third means achieves a desired IP within a range from ±1 to 5% and a high performance and low cost CRD for the first time without dropping the yield, increasing the chip size and increasing an unnecessary stock.

The adoption of the fourth means allows high precision and high speed fusion in the cutting of the fine region by laser light in a process for selecting a drain width as described above. Foe example, it is not easy to cut by laser Al which is generally used as a wiring metal because it reflects light. Further, although it is conceivable in principle to etch and remove by a photo-lithographic process, it is not realistic because it is very risky to return to a clean room after measuring IP in terms of contamination and others and it takes a considerable labor and time. Further, assuming that there are $2^5$ combinations of trimming bits for example, 32 types of new photo masks are required. Further, it is impossible to trim different bits among chips in one wafer using conventional photolithographic techniques. However, it is easy to achieve different trimming on each chip by laser. That is, by providing the poly-silicon fuses and using laser trimming, such CRD may be realized as a product for the first time.

The adoption of the fifth means avoids an increase of series resistance, though the poly-silicon fuses appear to be added in series in the middle of the drain electrode. The increase of the series resistance invites a drop of a drivability of the drain and leads to the increase of chip size of the CRD. The poly-silicon fuse may be effectively cut by the laser when the width of the poly-silicon (poly-silicon width 8003 in FIG. 8) is up to about 3 to 5 μm. If it becomes thicker than that, it becomes impossible to readily cut and contrary to that, the series resistance increases if it is thinned too much. Then, the increase of the series resistance is suppressed by arraying two or more fuses having 3 to 5μ of width in parallel per one bit. Although a plurality of fuses need by fused and cut by the laser per bit when selected, it can be done in a much shorter time than cutting one fuse having the same width in total (detailed explanation thereof is omitted here).

The adoption of the sixth means avoids an attenuation of the laser light in cutting the fuse and to perform the trimming process more effectively (in time-wise).

The adoption of the seventh means allows an increase in an operation maximum rating (breakdown voltage) up to 24 to 26 V from about 7 to 10 V of the past. Generally an inverse direction breakdown voltage of the MOS transistor is rate-determined and it may be represented in the order of a drain breakdown voltage (breakdown due to a concentration of electric field at a gate end of drain)<(punch through breakdown voltage)<snapback voltage<junction breakdown voltage of drain and field dope. Here concerning to the snapback, the NMOS comprises a NPN type bipolar transistor parasitically for example as shown in FIG. 14, a leak current between the drain and substrate increases as the drain voltage is raised. It becomes a base current of the NPN and it is turned ON. A state thereof is shown in FIG. 21. Although the aforementioned drain breakdown voltage normally determines the voltage rating, the snapback determines the rating in the case of the depletion transistor of the present invention.

A signal thus input with a voltage exceeding the drain breakdown voltage and snapback breakdown voltage may destroy the element. It may be an ESD (electro static discharge). The MOS structure is weak compared to the bipolar because it has the gate insulating film and it can be destroyed. Then, in order to raise the ESD breakdown voltage, a diode for protection is added as shown in FIG. 17. This is because the diode, i.e. a PN junction is stronger than a transistor against the ESD stress in terms of withstanding amount for releasing it. Then another N⁻ type layer is provided connecting with the drain to construct the diode to improve the ESD withstanding amount. The PN junction is formed by contacting the N⁺ type layer with the field doped P± type layer and the breakdown voltage of the PN junction may be set at 24 or 26 V assuming the drain breakdown voltage (which is determined by various conditions such as the thickness of the gate insulating film) is 30 V and the snapback voltage as 28 V. Because it is determined on the side where a concentration of impurities is thin, the P± type layer is appropriate to be 5 to $7 \times 10^{13}/cm^2$ in terms of dosed amount. The adoption of the eighth means allows to eliminate a photo lithographic process step, to reduce the processes (cost can be reduced) and to cut the cost for preparing photo masks in introducing the N type impurities in forming the N⁻ type layer of the DDD structure.

The adoption of the ninth means prevents a drop in drivability due to a back gate effect and a drop of the snapback voltage. This is because the substrate works as a series resistance if a distance from the drain and source to other portions having the substrate potential is long and the back gate effect and the drop of the snapback voltage becomes remarkable. An adequate effect can be expected by providing in a ratio of once in a plural times of repetition of the pairs of source and drain (preferably within six times).

The adoption of the tenth means allows the realization of a very high performance and low cost CRD for a semiconductor integrated circuit device having a low voltage (VL is low), low noise (operates in high-speed because it is not a bipolar device) and less dependency on voltage (a variation due to a fluctuation of power or voltage in the regulated current value is suppressed by suppressing an overemphasis on the channel length of ID by setting it more than L=8μ) and which allows an adequate gm because the gate insulating film is less than 500 angstrom and to suppresses the increase of the chip size.

The adoption of the 11-th means allows two CRDs to be formed with a reduced area from the fact that the source regions of two NMOSs are shared (thereby it allows one to reduce the cost and to accommodate the device in a small package). Further, a CRD accommodating with AC power source can be realized in the minimum area size and in one chip (one package).

The adoption of the 12-th means considerably reduces an influence of a resistance of the contact hole in the connection of the gate and source (which is generally called a contact resistance and which increases a resistance value and causes a problem as it is miniaturized further due to a micronization) and to reduce the chip size considerably.

The adoption of the 13-th means allows to reduce the influence of the contact resistance in the connection of the gate, source and substrate potential and to considerably reduce the chip size.

The adoption of the 14-th means allows to maintain an adequate ESD withstanding dose (more than 250 V in a mechanical mode and more than 2,000 V in a human model).

The adoption of the 15-th means allows packaging of the device in an axial lead type package because a cathode electrode may be provided on the die attaching side. The series resistance can be reduced by taking the cathode on the die attaching side when it is possible even in a DIP or surface packaging type package.

The adoption of the 16-th means allows packaging of the device in a glass sealing package because W-six can withstand a high temperature of about 600° C.

The adoption of the 17-th means allows to reduce an area of the element (chip size) because the L length of the transistor can be shortened.

The adoption of the 18-th means allows control of the ON/OFF state of the current of CRD by an external signal.

The adoption of the 19-th means allows to improve the drivability of the MOS transistor on the current path and to reduce the chip size. Further, an effect that the voltage VL can be lowered even further is brought about.

The adoption of the 20-th means allows a better current regulating characteristic because no influence of the resistance component of the poly-silicon fuse is received.

The adoption of the 21-st means brings about such effects that better current regulating characteristic can be obtained, the voltage of VL can be lowered, the drivability can be improved, the chip size can be reduced or the Vdd terminal can be used for a SW function.

The adoption of the 22-nd means allows to improve the performance of the device characteristics further from the effects brought about by the 21-st means.

The adoption of the 23-rd means allows the effect of reducing the chip size considerably.

The adoption of the 24-th means allows to similarly obtain a CRD in which the effects due to the 18-th means are improved further (CRD in which the 19-th to 23-rd means are applied).

The adoption of the 25-th means allows to obtain a CRD which has a high breakdown voltage and which can be operated in high-speed.

The adoption of the 26-th means allows to obtain the effect of reducing the chip size further.

The adoption of the 27-th means allows to obtain the effect of reducing the chip size further in a high performance and highly reliable CRD.

The adoption of the 28-th means allows to realize a more high performance semiconductor integrated circuit device for processing light and radiation and semiconductor integrated circuit device for driving external load.

The adoption of the 29-th means allows to fabricate the high performance (high-speed, high precision, low operating voltage and high breakdown voltage, etc.) CRD effectively in a low cost as the greatest effect of the present invention.

BRIEF DESCRIPTION OF THE DRAWINGS

FIG. 8 is a table showing target values of VTND, each IP value to fluctuation and accuracy when matched by trimming of the semiconductor integrated circuit device of the first embodiment of the present invention;

FIG. 41 is an explanatory diagram showing a circuit wherein the CRD of the 13-th embodiment of the present invention is actually used;

FIG. 42 is an explanatory diagram showing a circuit wherein the CRD of the 13-th embodiment of the present invention is actually used and applied;

FIG. 43 is a circuit diagram showing an equivalent circuit of a CRD according to a 14-th embodiment of the present invention;

FIG. 50 is a circuit diagram showing a trimming structure of a series resistance of the 19-th embodiment of the present invention;

FIG. 51 is a circuit diagram showing a second example of the trimming structure of the series resistance of the 19-th embodiment of the present invention;

FIG. 52 is a circuit diagram showing a third example of the trimming structure of the series resistance of the 19-th embodiment of the present invention;

DETAILED DESCRIPTION OF THE PROFFERED EMBODIMENTS

Figure 1:
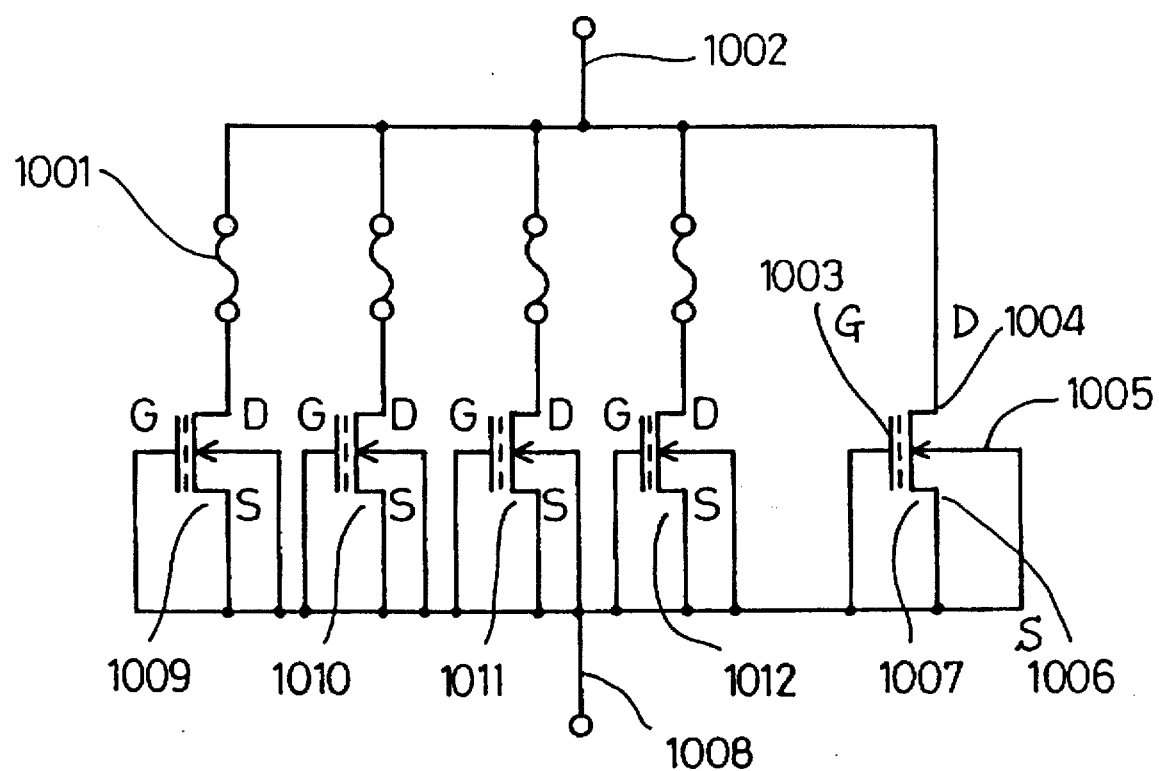
FIG. 1 is a circuit diagram showing an equivalent circuit of a semiconductor integrated circuit device of a first embodiment of the present invention.

Referring now to the drawings, preferred embodiments of the present invention will be explained.

FIG. 1 is a circuit diagram showing an equivalent circuit of a semiconductor integrated circuit device of a first embodiment of the present invention. It has an NMOS 1007 having a drain D (1004) with a first W width (550 μm×8 μm) to which NMOS 1009 having a drain with a second W width (250 μm), NMOS 1010 having a drain with a third width (500 μm), NMOS 1011 having a drain with a fourth width (1000 μm) and NMOS 1012 having a drain with a fifth width (2000 μm) are electrically connected in parallel by poly-silicon fuses 1001 to form an anode terminal 1002. A gate G (1003), source S (1006) and substrate 1005 of each are all electrically connected, forming a cathode terminal 1008. As described above, the second through fifth drain widths are arranged so as to be $250 \, \mu m \times 2^n \ldots$, n=0, 1, 2, 3, and the number of the drains is four in this embodiment.

Figure 2:
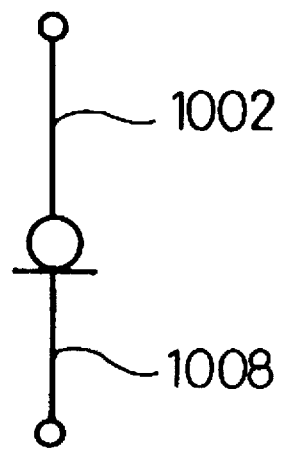
FIG. 2 is an explanatory drawing for showing an electrical function of a CRD of the first embodiment of the present invention.

FIG. 2 is an explanatory drawing for showing an electrical function of the CRD of the first embodiment of the present invention. It has two poles of the anode 1002 and cathode 1008.

Figure 3:
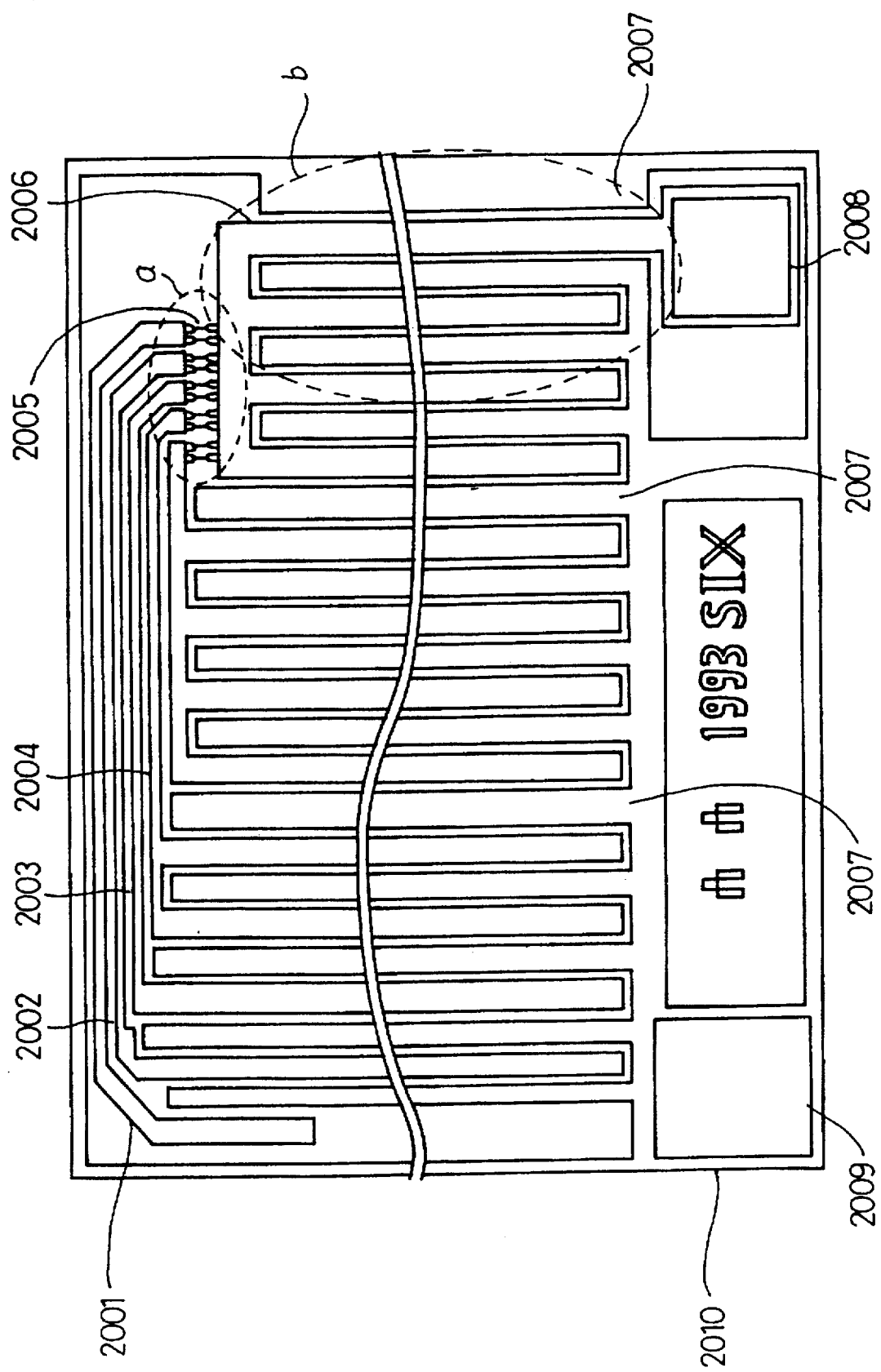
FIG. 3 is a plan view showing the semiconductor integrated circuit device of the first embodiment of the present invention.

FIG. 3 is a plan view showing the semiconductor integrated circuit device of the first embodiment of the present invention. In order to simplify the description, only the configuration of the electrode wirings and poly-silicon fuses are shown in this figure. It has an electrode 2006 having drains with a first W width (550 μm×8 μm) to which electrode 2001 having a drain with a second W width (250 μm), electrode 2002 having a drain with a third width (500 μm) electrode 2003 having a drain width with a fourth width (1000 μm) and electrode 2004 having a drain with a fifth width (2000 μm) are electrically connected in parallel by arrayed poly-silicon fuses 2005 to form an anode pad area 2008 from which current is output by means of wire bonding and the like to connect to a terminal of a package. A gate electrode, source electrode and substrate potential of each are all electrically connected to a cathode pad area as a common electrode wire 2010. There are three sections for taking the substrate potential from which a P-type layer of the substrate is exposed on the surface adjoining with the source area. Accordingly, the chip size is about 0.7 mm square in this embodiment.

Figure 4:
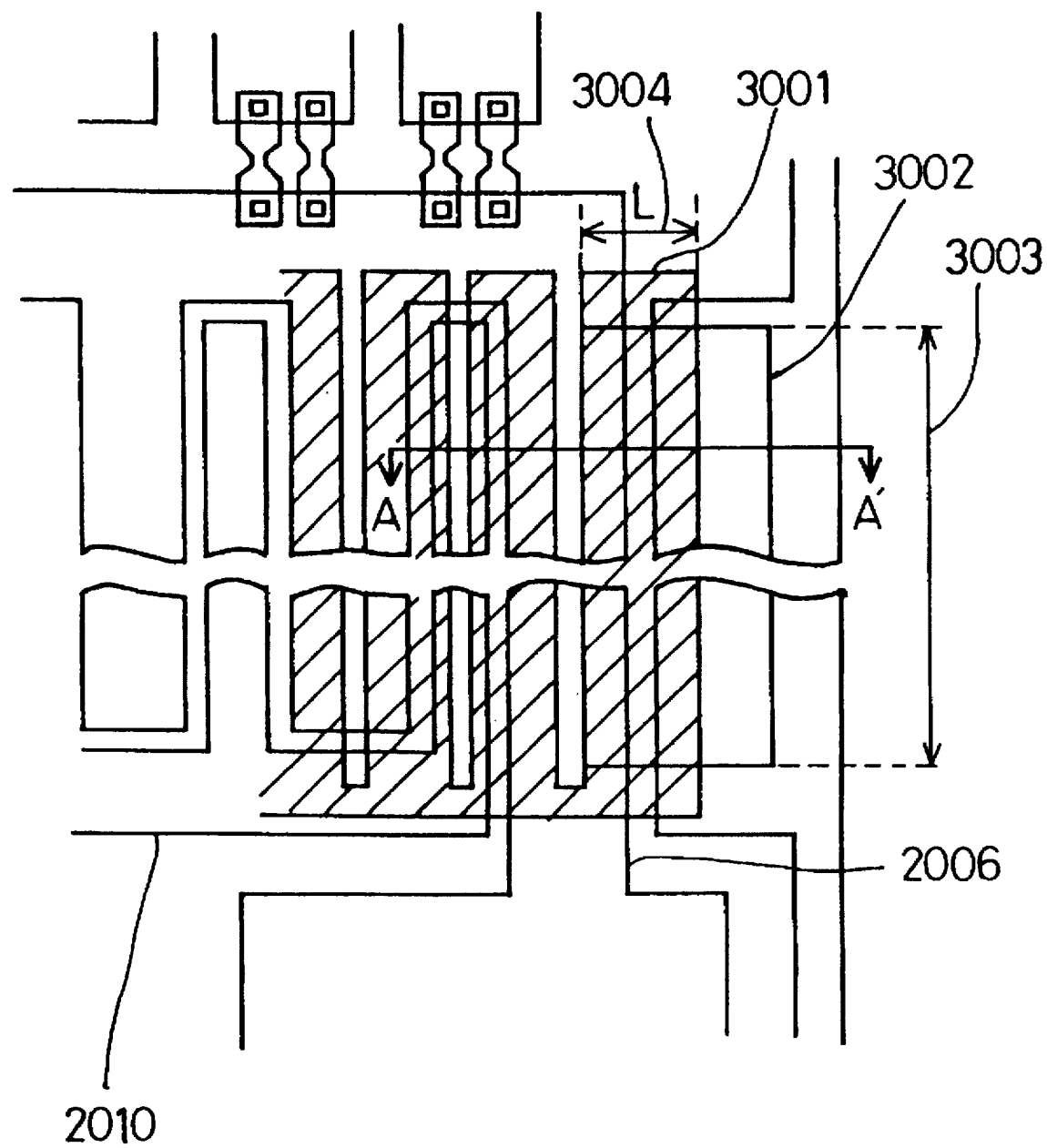
FIG. 4 is an enlarged plan view of a part (b) in FIG. 3.

FIG. 4 is an enlarged plan view of a part (b) in FIG. 3. It shows a relationship among the drain electrode wiring, source electrode wiring and gate poly-silicon 2001 (L=10 μm).

Figure 5:
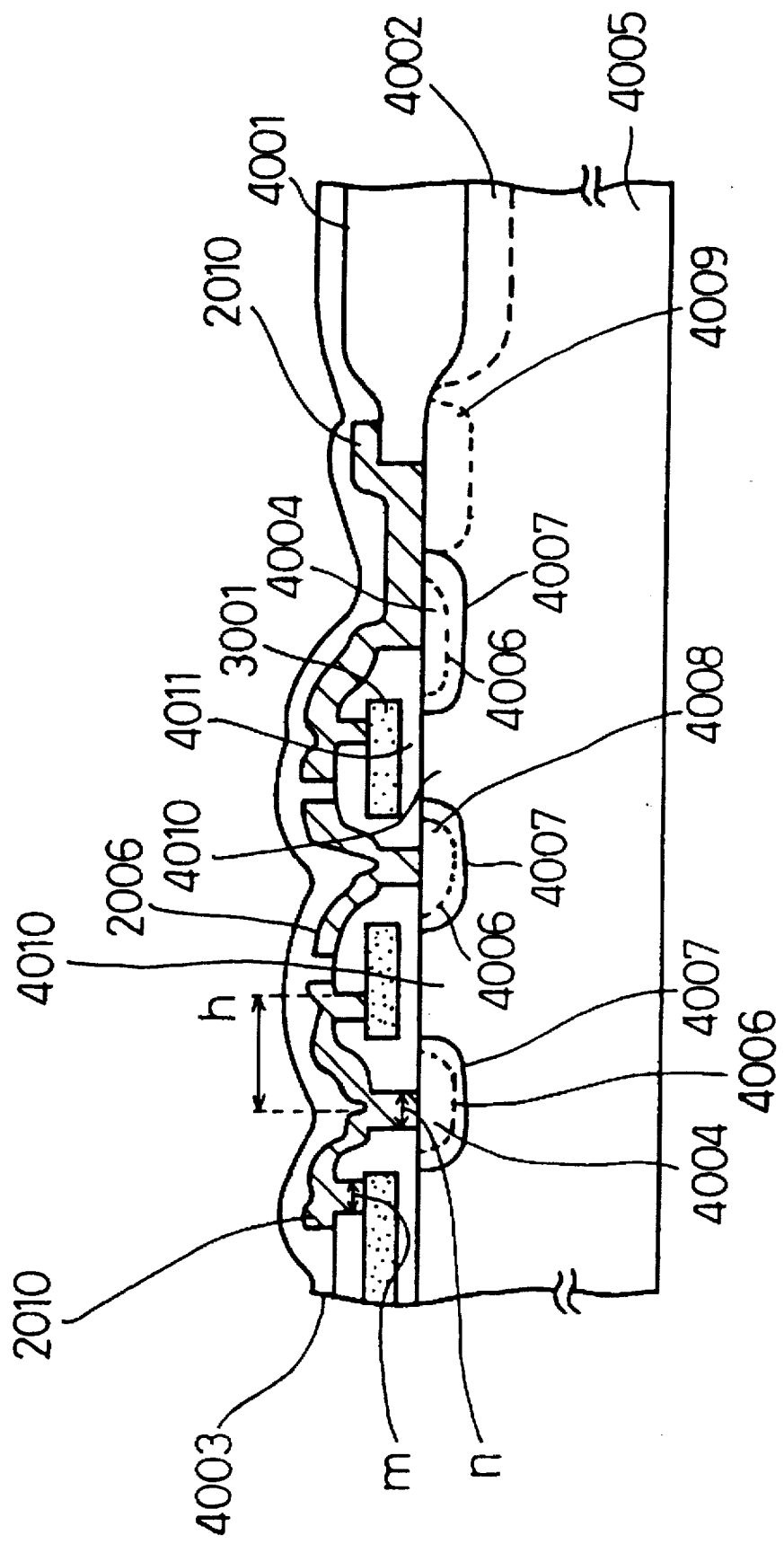
FIG. 5 is a section view showing the semiconductor integrated circuit device of the first embodiment of the present invention.

FIG. 5 is a section view showing the semiconductor integrated circuit device of the first embodiment of the present invention. It is equivalent to a section along line A—A' in FIG. 4. In addition to a drain 4008, a source 4004 also has a DDD structure in this embodiment. The DDD structure is constructed by a N⁻ type region 4007 and N⁺ region 4006. A P⁻ type substrate 4005 has a resistivity of 2 to 3 Ω.cm. A gate insulating film 4011 is 380 angstrom and a channel region 4010 is formed as a depletion type channel by introducing $8\times10^{11}/cm^2$ of phosphorus before forming a poly-silicon gate electrode 3001. The DDD structure is constructed by introducing the N⁻ type region 4007 with 1 to $3\times10^{14}/cm^2$ of dosed phosphorus and heating at 1100° C. for 60 minutes and then by introducing the N⁺ region 4006 with $3\times7\times10^{16}/cm^2$ of dosed phosphorus. Thus more than 40 V of drain breakdown voltage is obtained and more than 30 V of snapback voltage is obtained at the gate terminal (although the drain breakdown voltage does not exist in the case of the depletion transistor in a strict sense).

While the source and substrate are abutted, the source and gate electrode are arranged as shown by contact opening sections (m) and (n).

Figure 6:
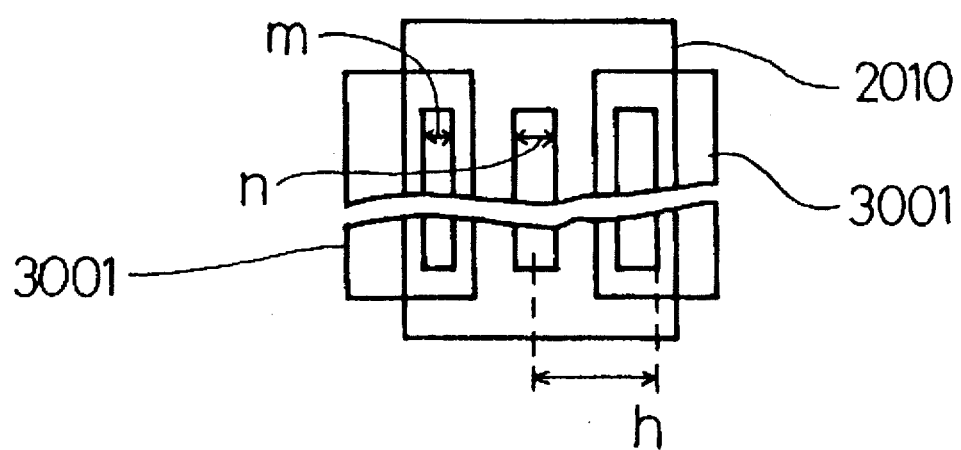
FIG. 6 is a plan view showing parts of contact opening sections (m) and (n) in FIG. 5.

FIG. 6 is a plan view showing parts of the contact opening sections (m) and (n) in FIG. 5. The source 2010 and gate 2010 each have independent contact holes (m) and (n) and are connected by the electrode wiring.

Figure 7:
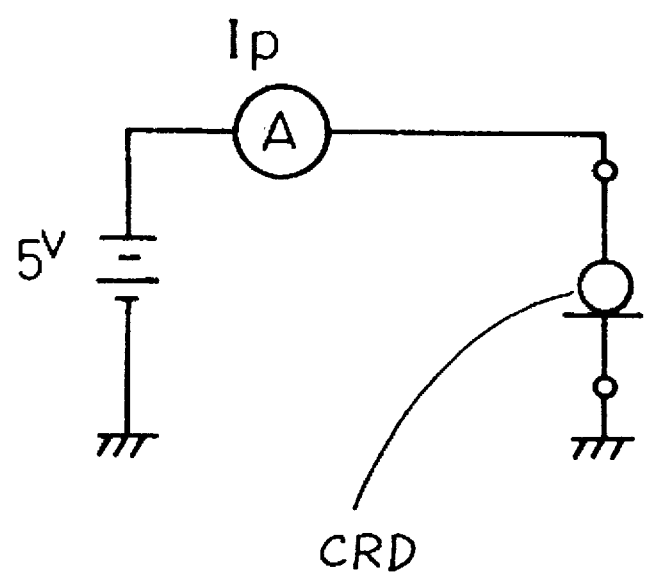
FIG. 7 is an explanatory diagram showing a circuit for inspecting the semiconductor integrated circuit device of the first embodiment of the present invention.

FIG. 7 is an explanatory diagram showing a circuit for inspecting the semiconductor integrated circuit device of the first embodiment of the present invention. Here it measures the total sum of IP (equivalent to 8150 μm) of the first drain of 4400 μm and the second through fifth drains of 3750 μm.

FIG. 8 is a table showing target values of VTND, each IP value to fluctuation and accuracy when matched by trimming of the semiconductor integrated circuit device of the first embodiment of the present invention. When the device is conventionally designed and if the VTND target value is –0.9 V, W is about 5555 μm since drivability per unit W is 1.8 μA/W as shown in the table. However, there exists ±0.15 V of fluctuation of VTND in fabrication even when a very high precision fabrication process is used. Accordingly, with W of 5555 μm, IP fluctuates from 7 to 13 mA. Then it is readily understood by considering that the first W is the upper limit of the fluctuation of the drivability (IP/W=2.4 μA) and is 10 mA and that the second drain is additionally connected when the fluctuation fluctuates below that.

Since the second drain varies from 250 μm to 500, 1000 and 2000 μm and the trimming is made by four bits, 16 stages of trimming is possible in a range from 250μ (naturally also 0 μm) to 3750 μm. Because the step per one stage (trimming accuracy) slightly differs depending on each VTND (each drivability), it shows up as shown in the table. While an example of 2ⁿ and 4 bits here, the number of bits may be increased or decreased corresponding to the accuracy (accuracy of one step) or a trimmable range. Further, it may be n-th power of 1.5 or 3 and n needs not be an integer. That is, an appropriate value may be set corresponding to characteristics of CRD desired to obtain based on this concept. Thus it is calculated how much W can be cut based on the IP measured in FIG. 7 and then bits of the fuse to be cut is determined.

Figure 9:
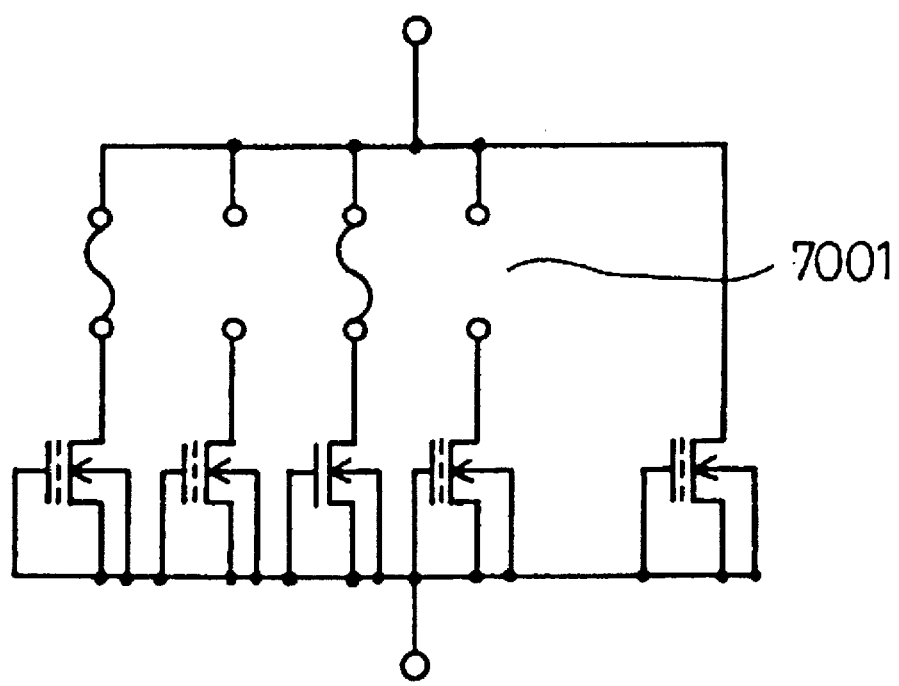
FIG. 9 is a circuit diagram showing bits trimmed in the present embodiment.

FIG. 9 is a circuit diagram showing bits trimmed in the present embodiment. In the figure, the trimmed bits (fuses) are shown.

Figure 10:
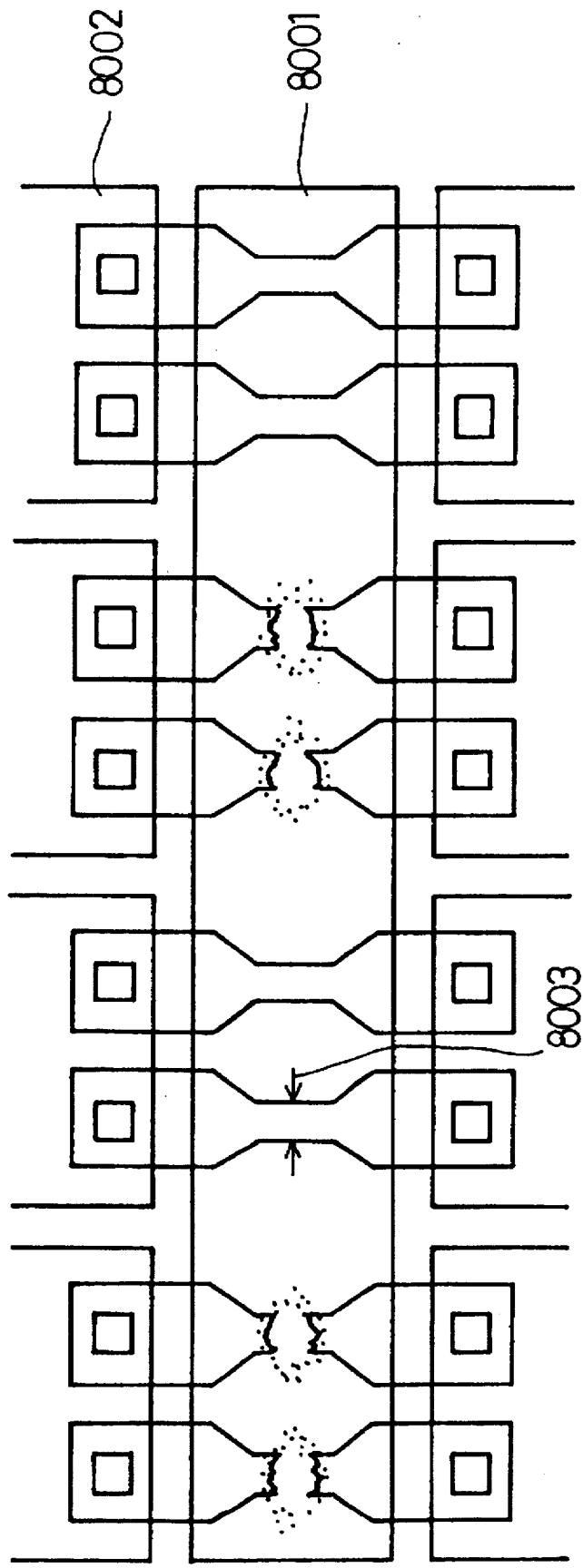
FIG. 10 is an enlarged plan view of a part (a) in FIG. 3.

FIG. 10 is an enlarged plan view of a part (b) in FIG. 3. The figure shows the poly-silicon fuses for trimming arranged by two per bit for four bits to the electrode wiring 8002 and a state wherein they are cut corresponding to FIG. 7. The width of the fuses is 3 to 4μ. A passivation film has a opening section 8001 in the fuse part.

Figure 11:
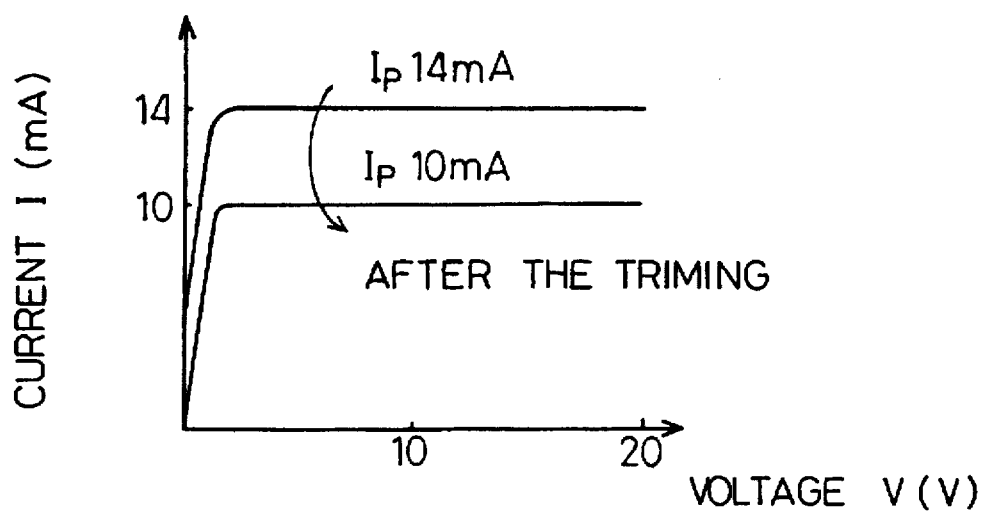
FIG. 11 is an explanatory diagram showing voltage-current characteristics before and after the trimming of the CRD of the semiconductor integrated circuit device of the present embodiment.

FIG. 11 is an explanatory diagram showing voltage-current characteristics before and after the trimming of the CRD of the semiconductor integrated circuit device of the present embodiment. In this case, it can be seen that 14 mA of IP before the trimming is completely matched to the IP target value of 10 mA.

Figure 12:
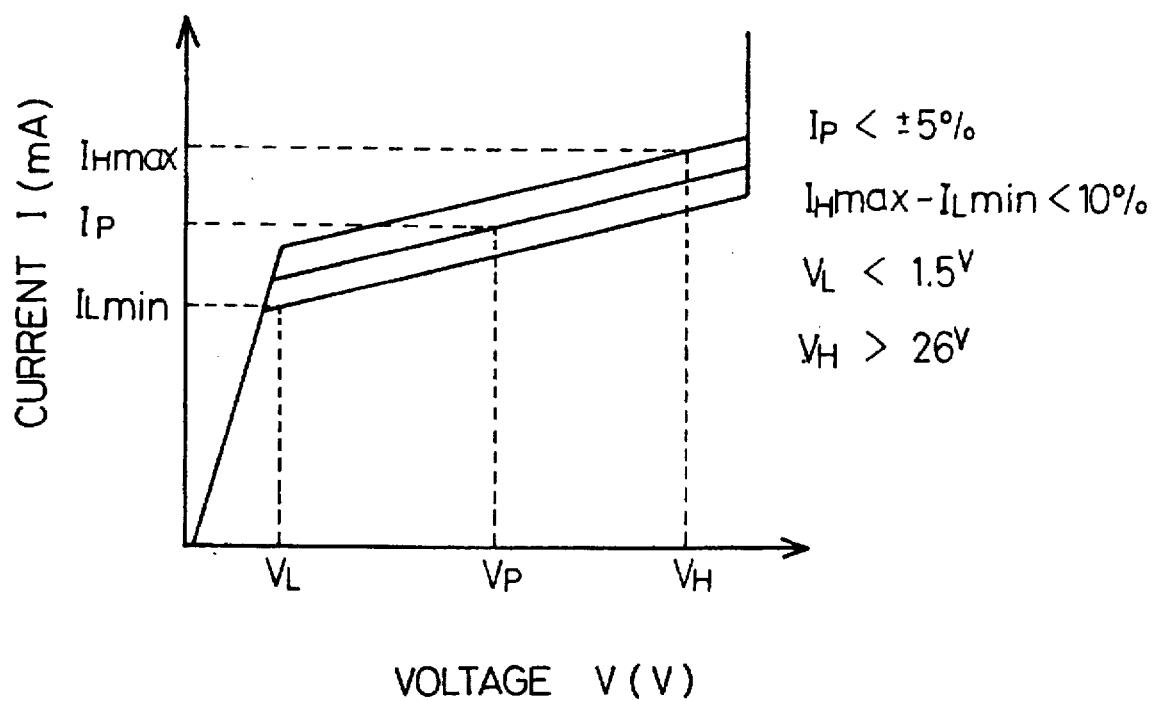
FIG. 12 is an explanatory diagram showing a fluctuation range of the voltage-current characteristics of the CRD of the semiconductor integrated circuit device of the present embodiment.

FIG. 12 is an explanatory diagram showing a fluctuation range of the voltage-current characteristics of the CRD of the semiconductor integrated circuit device of the present embodiment. The diagram is drawn exaggerated in order to specifically show the fluctuation and symbol of each value. As described above, a high performance CRD having less than 5% of fluctuation of IP or less than 10% of fluctuation in total to the center IP including I Hmax and I Lmin, less than 1.5 V of VL and more than 26 V of VH may be realized.

Figure 13:
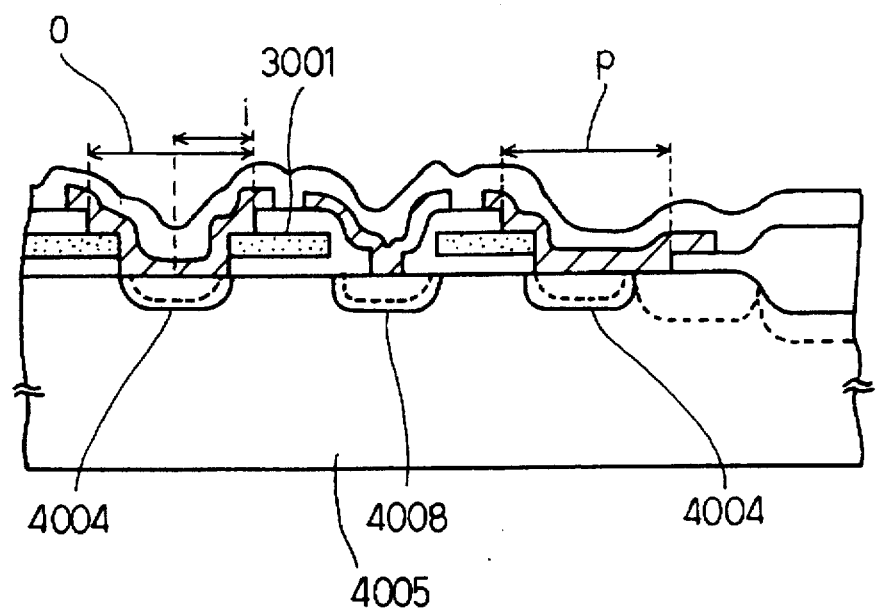
FIG. 13 is a section view showing a CRD of a semiconductor integrated circuit device according to a second embodiment of the present invention.
Figure 14:
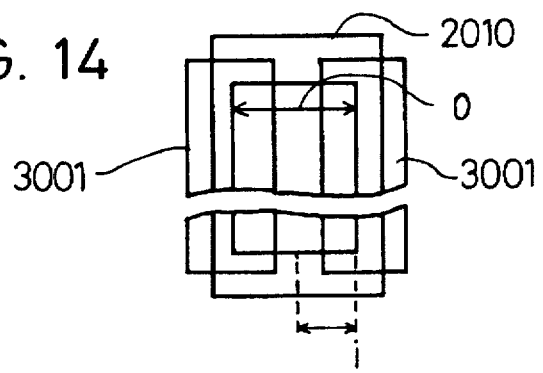
FIG. 14 is a plan view showing a part of a contact opening section (O) in FIG. 13.

FIG. 13 is a section view showing a CRD of a semiconductor integrated circuit device according to a second embodiment of the present invention. A source region 4004 and gate electrode 3001 are aligned with a contact opening section (O). FIG. 14 is a plan view showing a part of the contact opening section (O) in FIG. 13. The size (i) is shortened by several microns to several tens of microns as compared to the size (h) in FIG. 6. Accordingly, its effect is significant and it allows to reduce the chip size by a fraction of a mm to several mm in the transverse direction. It also contributes to reducing the contact resistance and allows to improve the drivability.

Figure 15:
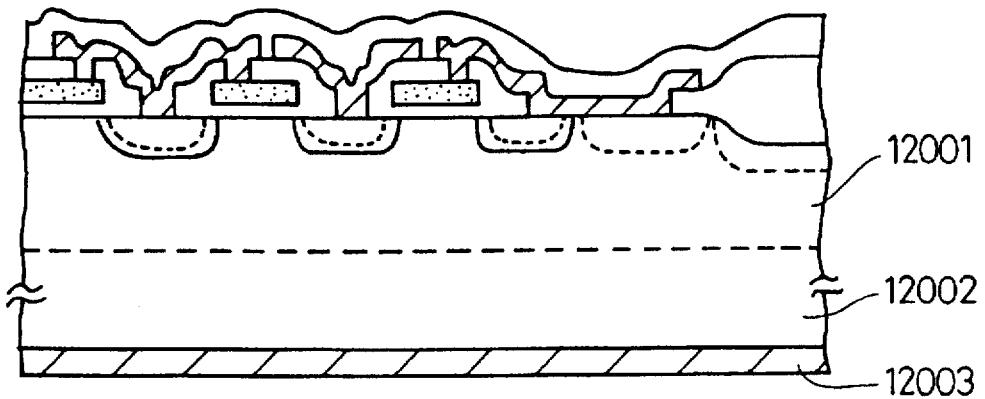
FIG. 15 is a section view showing a CRD of a semiconductor integrated circuit device according to a third embodiment of the present invention.

FIG. 15 is a section view showing a CRD of a semiconductor integrated circuit device according to a third embodiment of the present invention. A P⁻ type epi-layer 12001 having several Ω.cm of specific resistance is formed on a P⁺ type substrate 12002 having less than a fraction of an Ω.cm in specific resistance. After that, the CRD of the semiconductor integrated circuit device is formed as described above and a cathode 12003 on the back is formed in the final stage of the process. Because the cathode electrode can be taken on the die attach side, it allows packaging in an axial lead type package. Furthermore, this structure reduces the series resistance in a DIP and other surface packaging type packages when the cathode can be formed on the die attach side. Still more, because it also allows a reduction in the series parasitic resistance of the substrate, it improves the drivability as well as the snapback voltage.

Figure 16:
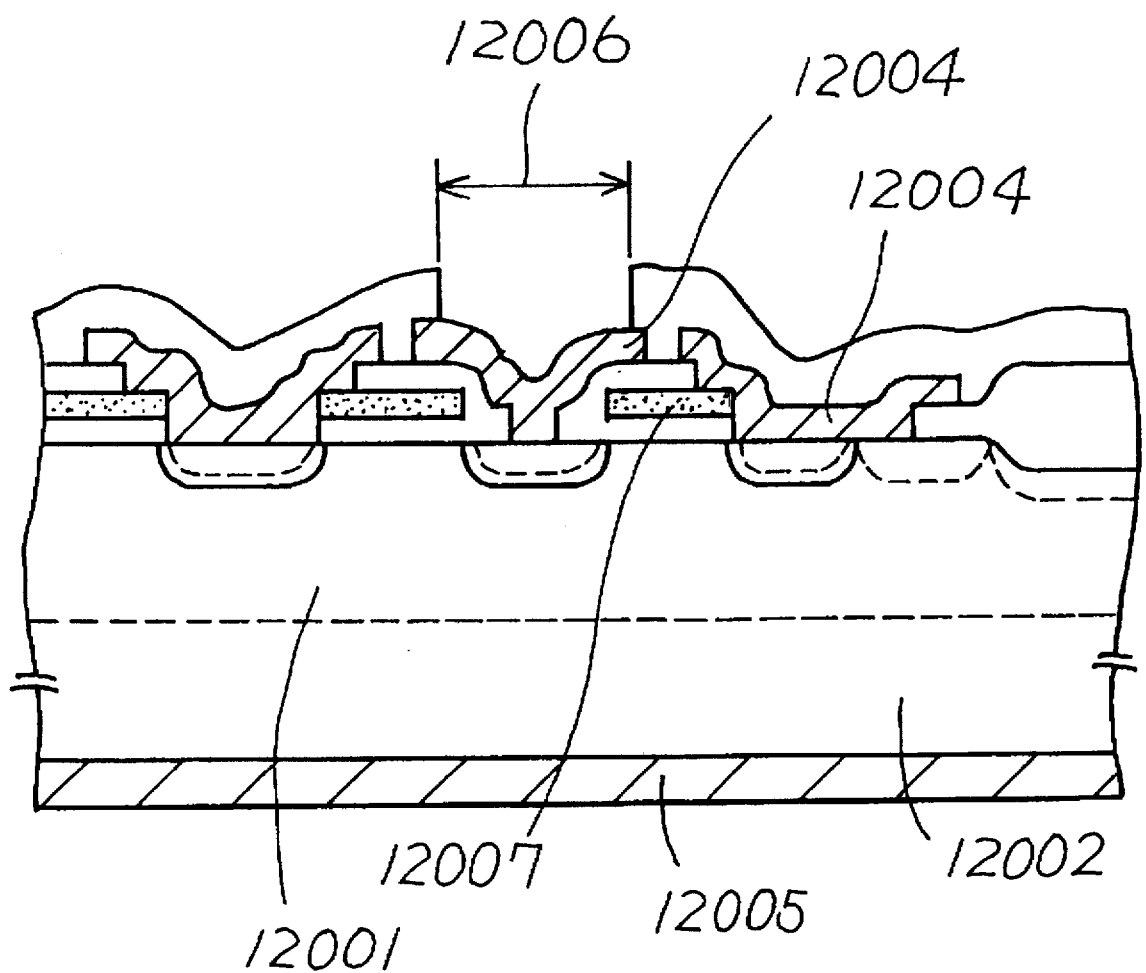
FIG. 16 is a section view showing the CRD of the semiconductor integrated circuit device in a second application example of the third embodiment of the present invention.

FIG. 16 is a section view showing the CRD of the semiconductor integrated circuit device in a second application example of the third embodiment of the present invention. A high fusion point metal silicide such as W-Six (tungsten silicide) is used for a gate electrode 12007 and wiring metal 12004. Further, Ni (nickel) or the like is used for a cathode electrode 12005 on the back. The reference numeral (12006) denotes a drain electrode opening section. By constructing the CRD as described above, glass sealing may be applied in packaging of the CRD in an axial lead type package because W-Six withstands heat treatment in the range of 600° to 1000° C.

Figure 17:
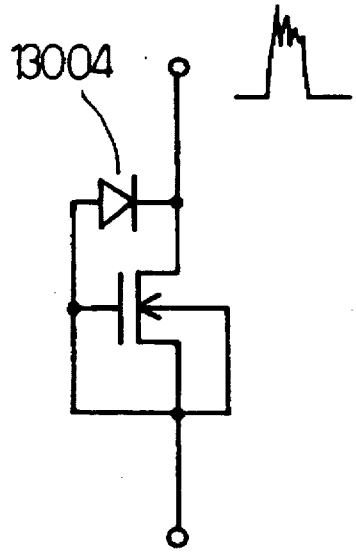
FIG. 17 is a circuit diagram of a CRD of a semiconductor integrated circuit device according to a fourth embodiment of the present invention.

FIG. 17 is a circuit diagram of a CRD of a semiconductor integrated circuit device according to a fourth embodiment of the present invention. A protection diode 13004 is connected parasitically and equivalently between a gate and drain.

Although the NMOS transistor of the CRD in the present embodiment is actually constructed so as to select a plurality of drains as shown in FIG. 1 or FIG. 9, these may be omitted in the figure for convenience when they are not related with the measure for regulating current.

Figure 18:
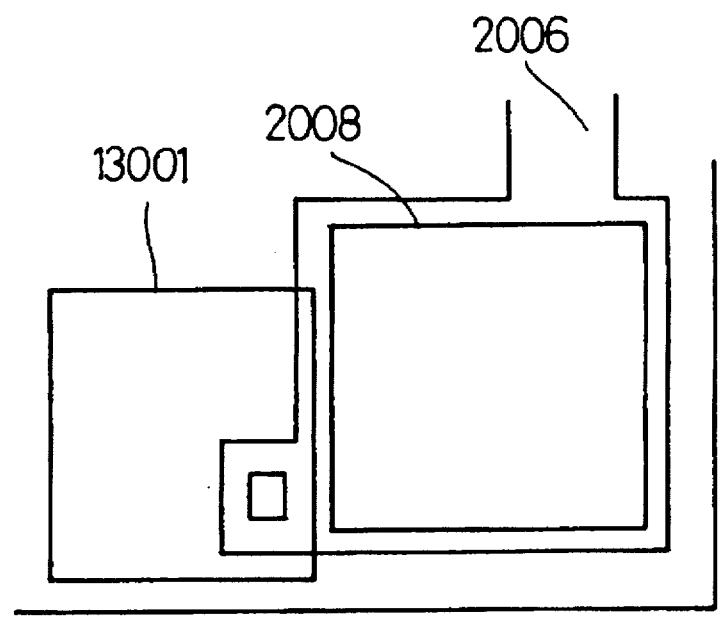
FIG. 18 is a plan view showing a part of the CRD of the semiconductor integrated circuit device of the fourth embodiment of the present invention.

FIG. 18 is a plan view showing a part of the CRD of the semiconductor integrated circuit device of the fourth embodiment of the present invention. A drain electrode 2006, anode pad 2008 and N+ type layer 13001 are provided on a substrate.

Figure 19:
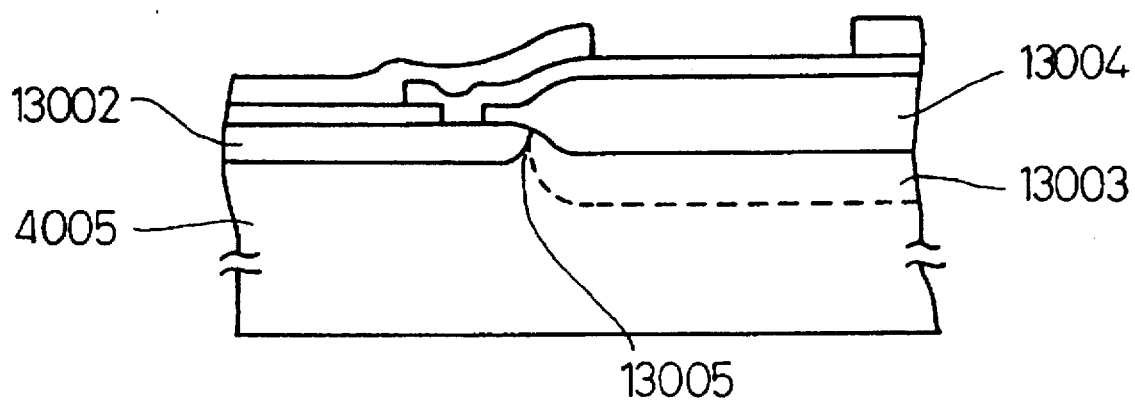
FIG. 19 is a section view showing the part of the CRD of the semiconductor integrated circuit device of the fourth embodiment of the present invention.

FIG. 19 is a section view showing the part of the CRD of the semiconductor integrated circuit device of the fourth embodiment of the present invention. 5 to $7 \times 10^{13}/cm^2$ of boron is introduced to a P± type field dope layer 13003 before forming a LOCOS oxide film 13004 to form a P⁻ type substrate 4005. N+ type layer 13002 has the same DDD structure in the source and drain. Thus a junction of 27 to 28 V of breakdown voltage is obtained and it breaks down prior to snapback thus protecting the NMOS of the main element. The breakdown of the junction here is generally what releases stress power reversibly and is not an irreversible breakdown. Of course it may end up in thermal breakdown if the power is great, but generally a PN junction is much stronger than a MOS structure having a gate insulating film and it is appropriate to use it as a protection element. Thereby the CRD having a sufficient ESD withstanding value (more than 250 V in mechanical model and more than 2000 V in human model) may be realized.

Figure 20:
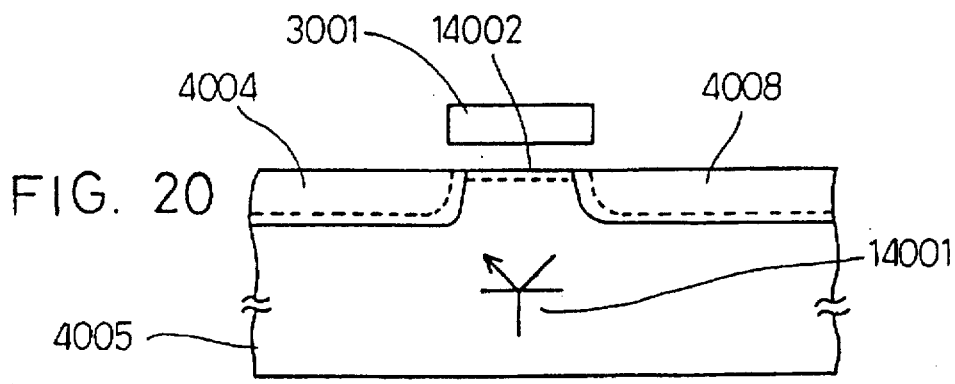
FIG. 20 is a section view of a NMOS transistor for explaining the fourth embodiment of the present invention.

FIG. 20 is a section view of a NMOS transistor for explaining the fourth embodiment of the present invention. In the figure, a parasitic NPN bipolar transistor 14001 is shown. A depletion type channel region 14002 is located between a source region 4004 and drain region 4008 on a P⁻ type substrate and a gate electrode 3001 is formed on top of that.

Figure 21:
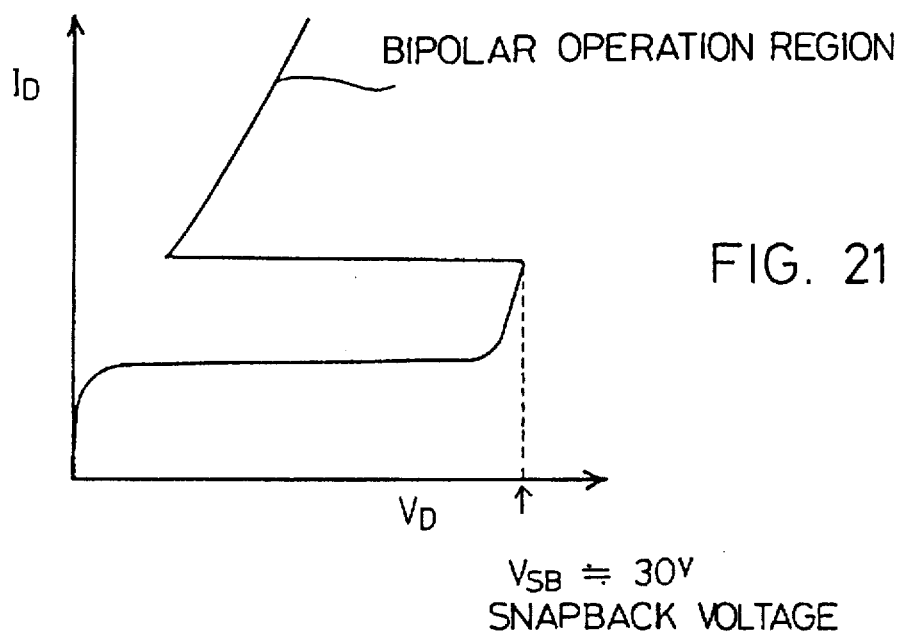
FIG. 21 is an explanatory diagram showing a snapback of the depletion type NMOS transistor for explaining the fourth embodiment of the present invention.

FIG. 21 is an explanatory diagram showing a snapback of the depletion type NMOS transistor for explaining the fourth embodiment of the present invention.

Figure 22:
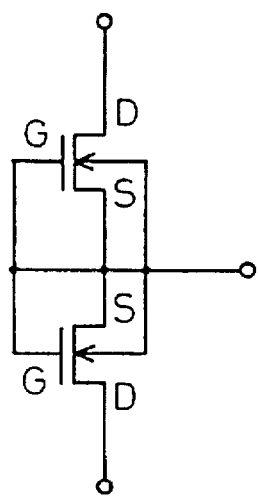
FIG. 22 is a circuit diagram of a CRD of a semiconductor integrated circuit device according to a fifth embodiment of the present invention.

FIG. 22 is a circuit diagram of a CRD of a semiconductor integrated circuit device according to a fifth embodiment of the present invention.

Figure 23:
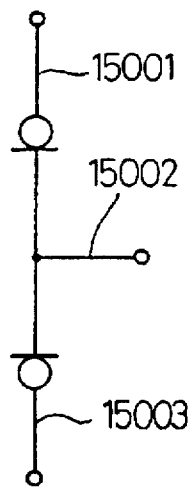
FIG. 23 is a circuit diagram of the CRD of the semiconductor integrated circuit device of the fifth embodiment of the present invention.

FIG. 23 is a circuit diagram of the CRD of the semiconductor integrated circuit device of the fifth embodiment of the present invention.

Figure 24:
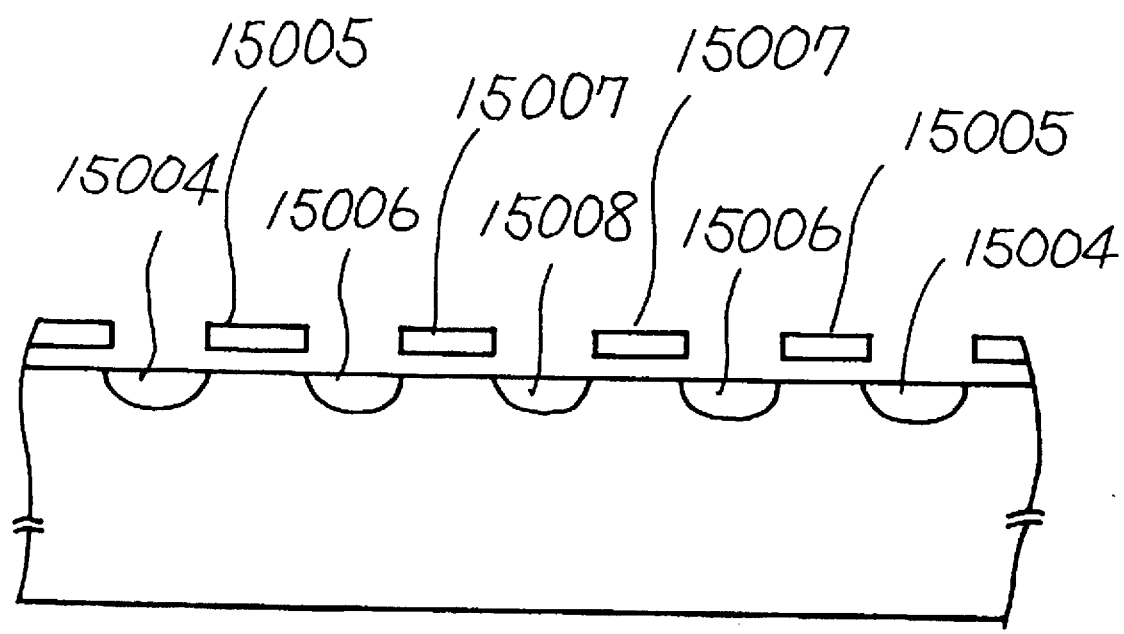
FIG. 24 is a section view of the CRD of the semiconductor integrated circuit device of the fifth embodiment of the present invention.

FIG. 24 is a section view of the CRD of the semiconductor integrated circuit device of the fifth embodiment of the present invention. The reference numeral (15004) denotes a drain region of a transistor 1, (15005) a gate electrode of the transistor 1 and (15006) a source region of the transistor 1 and is a source region of a transistor 2 at the same time. The reference numeral (15007) denotes a gate electrode of the transistor 2 and (15008) a drain region of the transistor 2.

By thus sharing the same source region, two elements may be constructed with an increased area of just about 1.5 times that of a single element type CRD as a whole like in the present embodiment.

Figure 25:
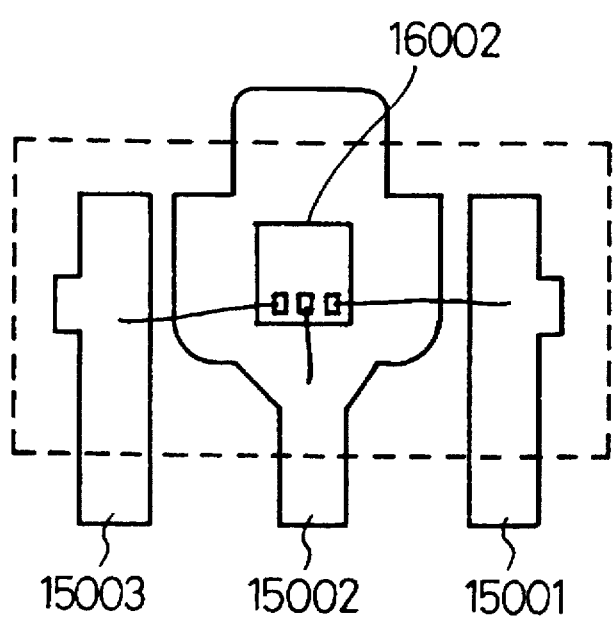
FIG. 25 is an explanatory diagram showing an inside wherein the CRD of the semiconductor integrated circuit device of the fifth embodiment Of the present invention is packaged.

FIG. 25 is an explanatory diagram showing an inside wherein the CRD chip 16002 of the semiconductor integrated circuit device of the fifth embodiment of the present invention is packaged.

Figure 26:
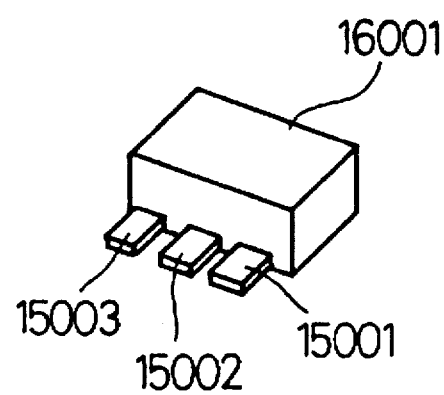
FIG. 26 is a perspective view of the packaged CRD of the semiconductor integrated circuit device of the fifth embodiment of the present invention.

FIG. 26 is a perspective view of the packaged CRD of the semiconductor integrated circuit device of the fifth embodiment of the present invention.

Figure 27:
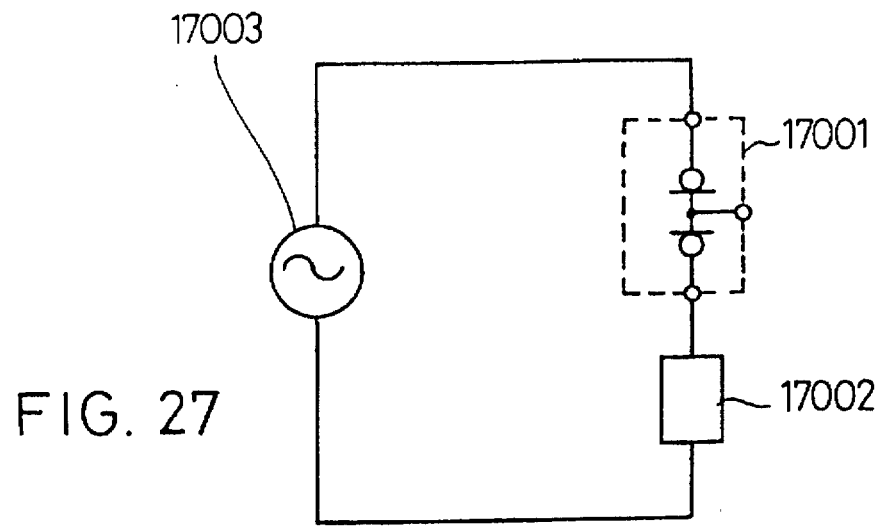
FIG. 27 is a circuit diagram showing a first application example of the CRD of the semiconductor integrated circuit device of the fifth embodiment of the present invention.

FIG. 27 is a circuit diagram showing a first application example of the CRD of the semiconductor integrated circuit device of the fifth embodiment of the present invention.

Figure 28:
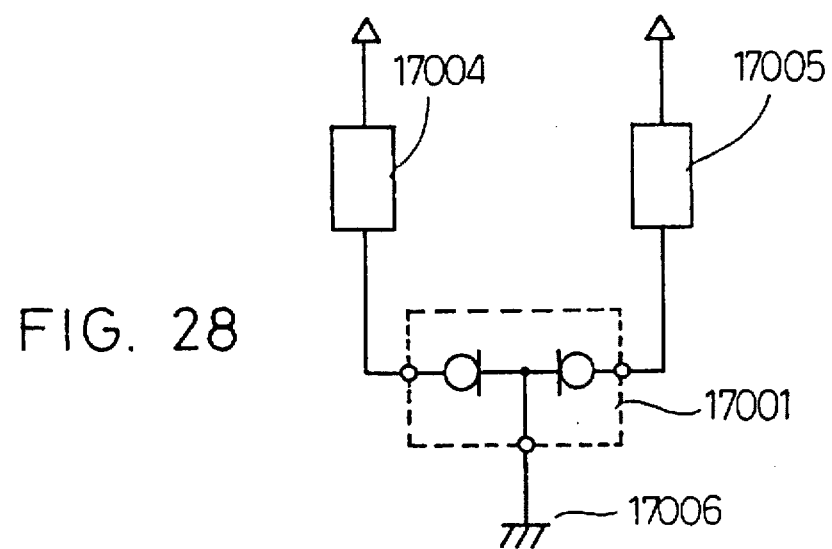
FIG. 28 is a circuit diagram showing a second application example of the CRD of the semiconductor integrated circuit device of the fifth embodiment of the present invention.

FIG. 28 is a circuit diagram showing a second application example of the CRD of the semiconductor integrated circuit device of the fifth embodiment of the present invention.

Figure 29:
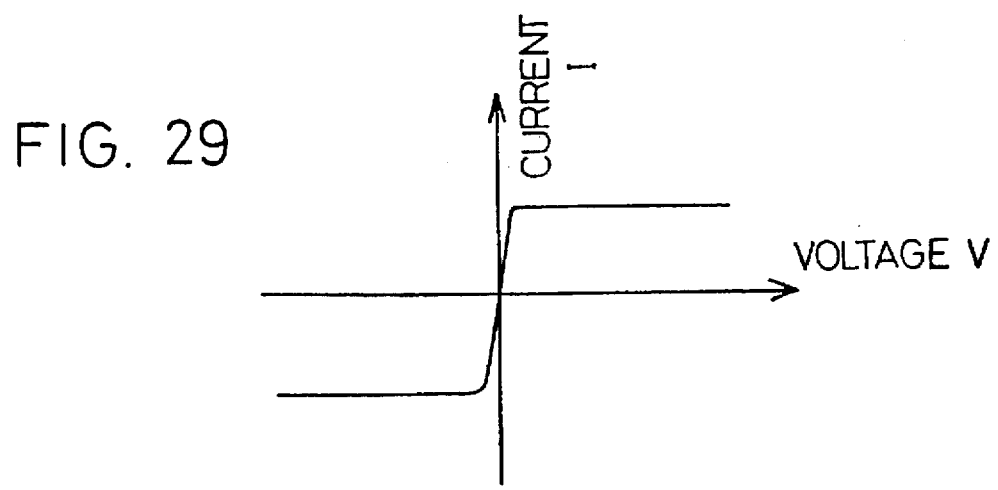
FIG. 29 is an explanatory diagram showing voltage-current characteristics at anodes 1 and 2 of the CRD of the semiconductor integrated circuit device of the fifth embodiment of the present invention.

FIG. 29 is an explanatory diagram showing a voltage-current characteristic at anodes 1 and 2 of the CRD of the semiconductor integrated circuit device of the fifth embodiment of the present invention. The use of the present embodiment thus allows the fabrication of two CRDs whose area is reduced by sharing the source regions of two NMOSs (which are low cost and are readily accommodated in a small package). Further, it allows realization of a CRD for an AC power source with a minimum area and size in one chip (one package).

Figure 30:
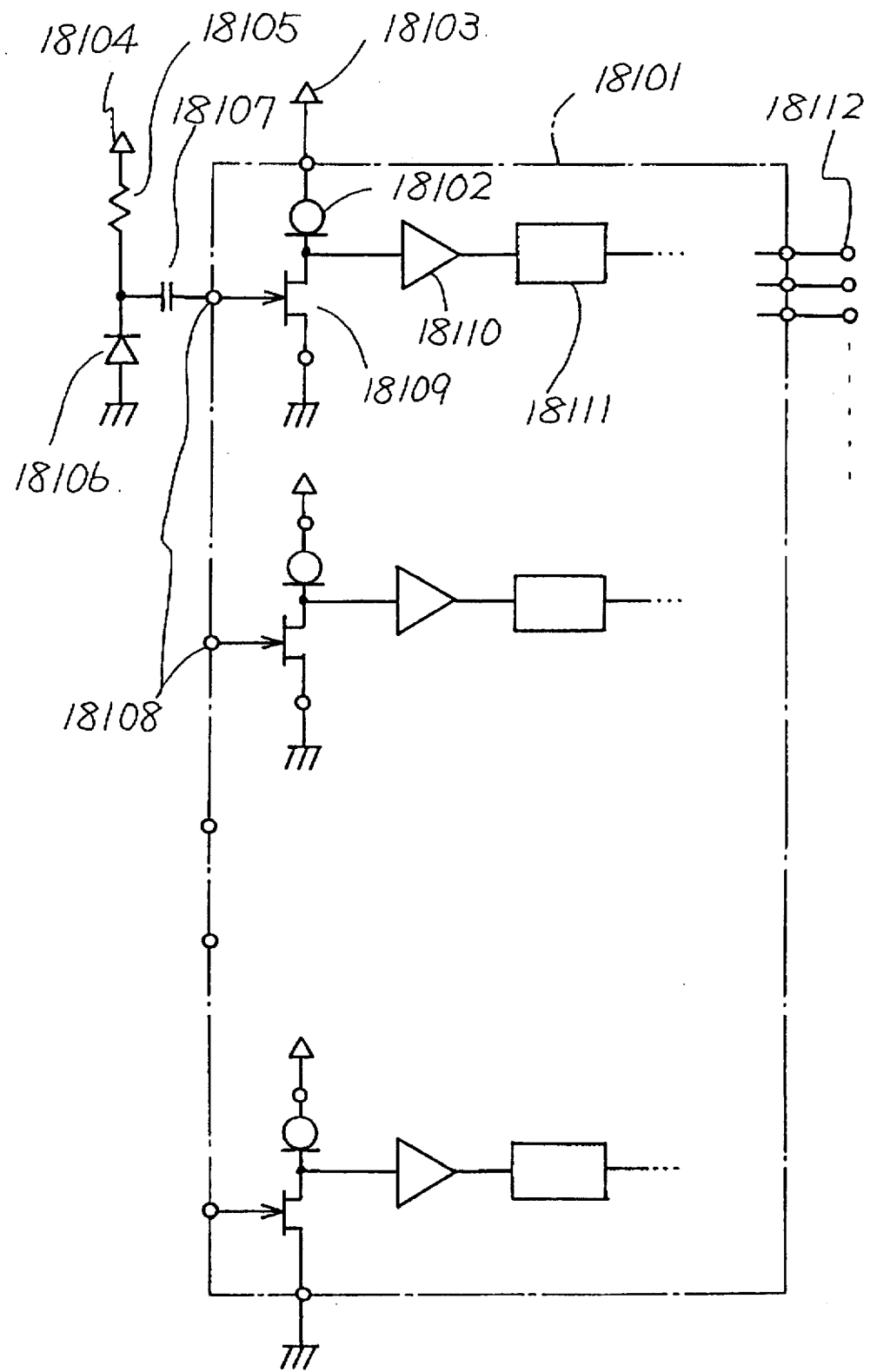
FIG. 30 is an explanatory diagram showing a semiconductor integrated circuit device containing a plurality of CRDs of the present invention and having a multi-channel input terminal according to a sixth embodiment of the present invention.

FIG. 30 is an explanatory diagram showing a semiconductor integrated circuit device (18101) containing a plurality of CRDs of the present invention and having a multi-channel input terminal according to a sixth embodiment of the present invention. The figure shows a structure of a basic circuit for detecting light or radiation which are integrated by a plurality of channels to structure a pre-semiconductor integrated circuit device (IC) for detecting light and radiation.

The reference numeral (18106) denotes a photo diode such as a PIN diode for detecting light and radiation, (18105) a bias resistance and (18104) a bias power source VH to which a high voltage of several tens to several hundreds V is normally applied. A JFET 18109 is biased by a regulated current (several mA to several tens of mA) by a CRD 18102 of the present invention. A signal input to an input terminal 18108 via a read coupling capacitor 18107 is input to the JFET, is then processed via a pre-amplifier 18110 and a circuit 18111 such as a sample and hold or waveform rectifying circuit and is output to an output terminal 18112. Conventionally, a bias current of each channel has been determined not by a CRD but by a resistance. Although it took time in that case to adjust currents of each channel due to a fluctuation of gain of the JFET of each channel and the like (resistance values vary depending on the channels), a very high performance pre-semiconductor integrated circuit device for detecting light and radiation may be simply realized by adapting the present embodiment.

Figure 31:
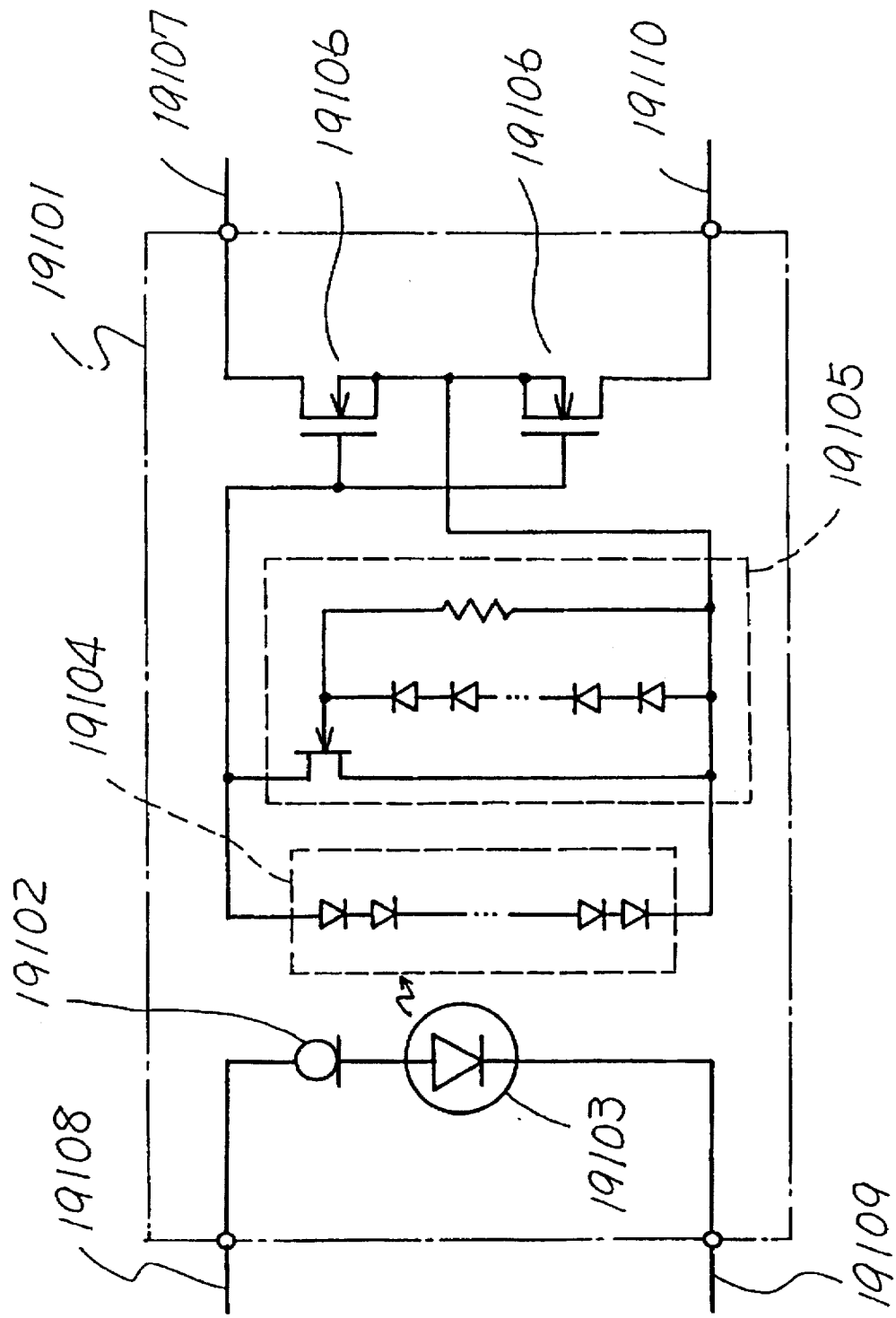
FIG. 31 is a circuit diagram showing a SSR containing a CRD chip of the present invention according to a seventh embodiment of the present invention.

FIG. 31 is a circuit diagram showing a SSR (19101) containing the CRD chip of the present invention according to a seventh embodiment of the present invention. The term SSR refers to a solid state relay. When a current flows between a primary input terminal +19108 and a primary input terminal 19109−, a light emitting diode 19103 illuminates an electro motive force photo diode array 19104 which receives the light and generates a voltage, turning on a gate of NMOS transistors 19106 for secondary output to conduct bilaterally between a secondary output terminal 19107 and a secondary output terminal 19110. The reference numeral (19105) denotes a circuit for discharging the charge when turning off. Conventionally, a CRD 19102 of the present invention shown in FIG. 31 has not been provided and an external resistance source has been used to obtain a necessary current. When it is used in an application where the input side power voltage fluctuates, however, speed of the ON/OFF operation of the transistor changes, the transistor does not turn ON or it breaks down overflowing a current. The inclusion of the CRD chip of the present invention in the present embodiment allows a readily usable high performance SSR. It is because the current is constant, the brightness of the LED is constant, the ON/OFF speed is constant, protection from over-current is achieved and a regulated current can be obtained even in low voltage because VL is also low.

Figure 32:
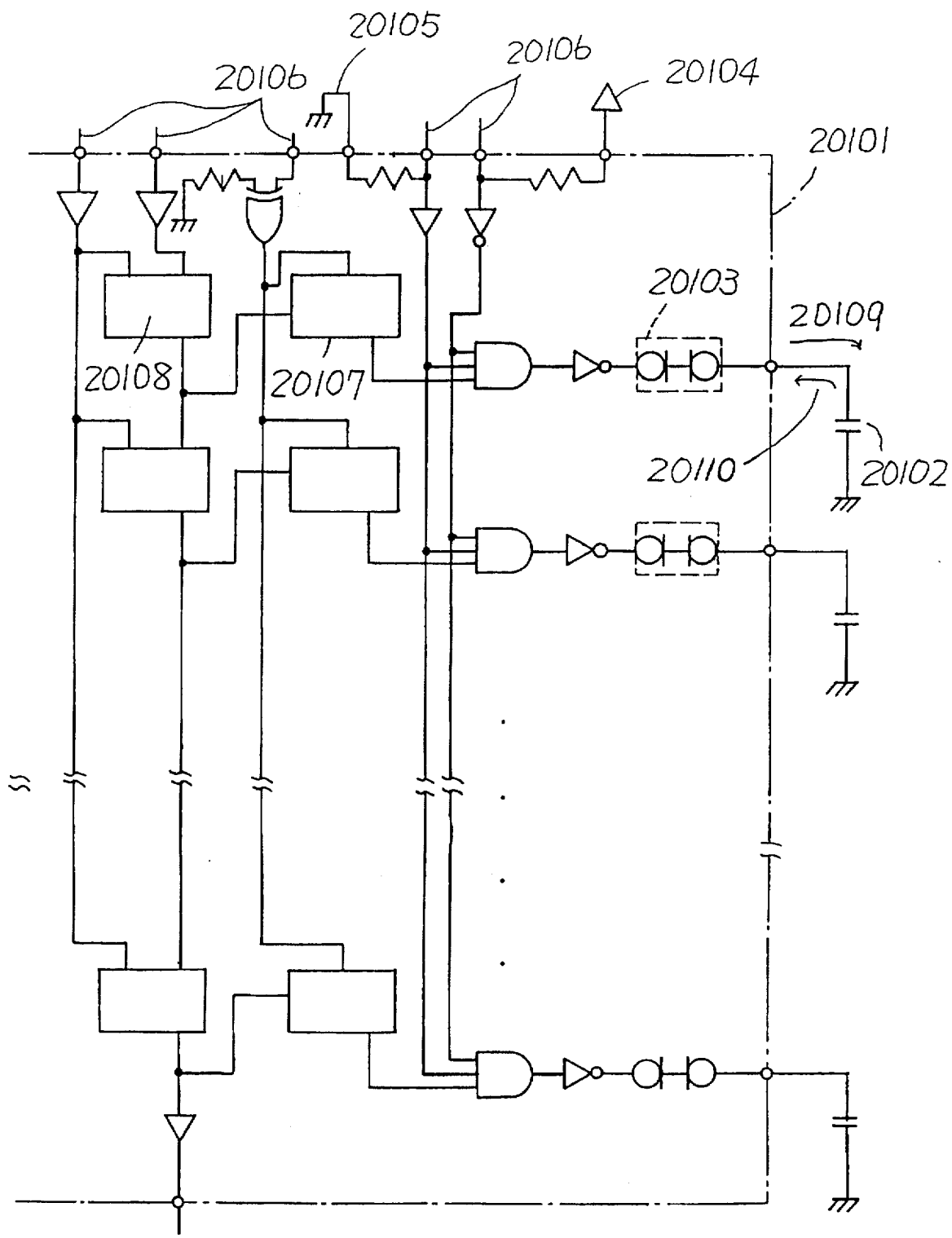
FIG. 32 is an explanatory diagram showing a semiconductor integrated circuit device containing a plurality of CRDs of the present invention and having a multi-channel output terminal according to an eighth embodiment of the present invention.

FIG. 32 is an explanatory diagram showing a semiconductor integrated circuit device (20101) containing a plurality of CRDs of the present invention and having a multi-channel output terminal according to an eighth embodiment of the present invention.

The reference numeral (20104) denotes a Vdd terminal, (20105) a GND (ground) terminal and (20106) various input terminals. An internal circuit composed of a so-called shift register structured by a latch (LA) circuit 20107 and a dynamic flip-flop (DFF) circuit 20108 drives an external load 20102 (which indicates a capacitive load such as a liquid crystal here) via the pair of CRDs 20103 explained in the fifth embodiment of the present invention. In a case of capacitive load as such, a flow-out output current Iout 20109 and flow-in output current Isinn 20110 must be a regulated current and it may be realized for the first time by the CRD element of the present invention.

Figure 33:
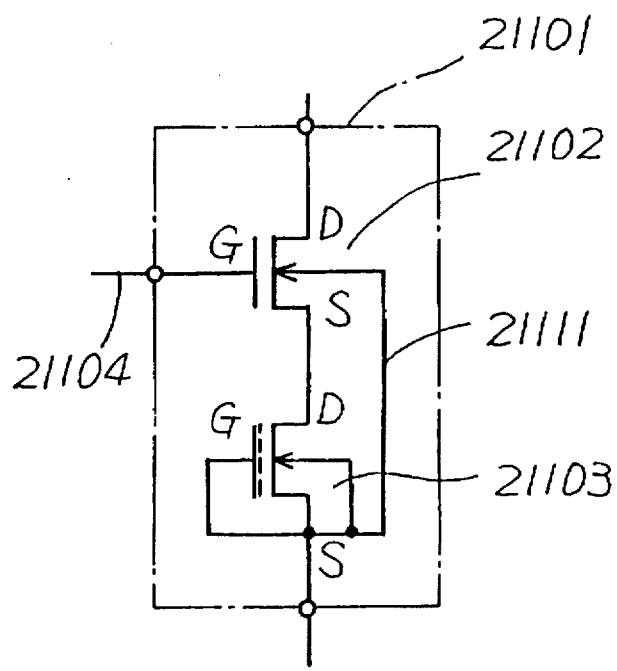
FIG. 33 is a circuit diagram showing a CRD with SW according to a ninth embodiment of the present invention.
Figure 34:
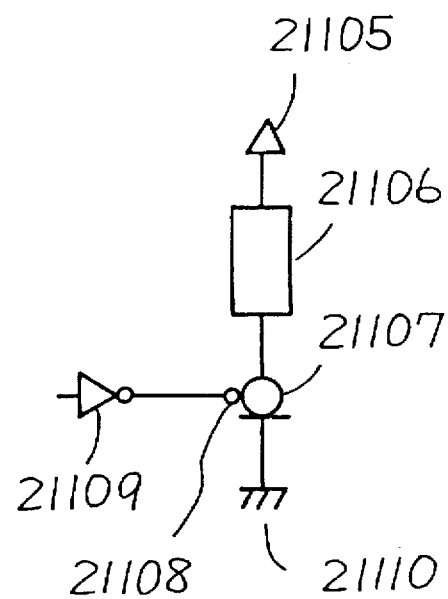
FIG. 34 is a circuit diagram showing a circuit using the CRD with SW of the ninth embodiment of the present invention.

FIG. 33 is a circuit diagram showing a CRD with SW (switch, ON/OFF control terminal) (21101) according to a ninth embodiment of the present invention. The reference numeral (21102) denotes an enhancement type NMOS transistor for performing the SW function (a normally-off type transistor whose threshold voltage VTH is plus VTH, not minus VTH like that of a depletion type. It is referred to as an enhancement or enhanced transistor), (21103) a NMOS depletion transistor having a regulated current of the present invention, (21111) a symbol indicating a transistor substrate and (21104) a SW terminal which causes the CRD to turn ON when a H (Hi, +, plus voltage) signal is supplied, thus flowing a certain regulated current. FIG. 34 is a circuit diagram showing a circuit using the CRD with SW (21107) of the ninth embodiment of the present invention. The reference numeral (21105) denotes a Vdd, (21106) a load, (21108) a symbol of the SW terminal, (21110) a GND and (21109) a symbol of an inverter for supplying the ON/OFF signal from the outside. Of course, a plus/minus voltage may be supplied by incorporating some switching circuit beside a TTL and CMOS logic. A source of the enhancement type transistor shown in FIG. 33 and a drain of depletion type transistor may share their region as described in the fifth embodiment and the CRD with SW of the present embodiment which requires an area of two transistors may be realized with about 1.5 times of the area. In the figure, a state of trimming of drain fuses of the depletion transistor (regulated current side) is omitted to simplify the figure. An electrostatic protection element related to a gate terminal of the enhanced transistor which is the SW terminal is also omitted.

Figure 35:
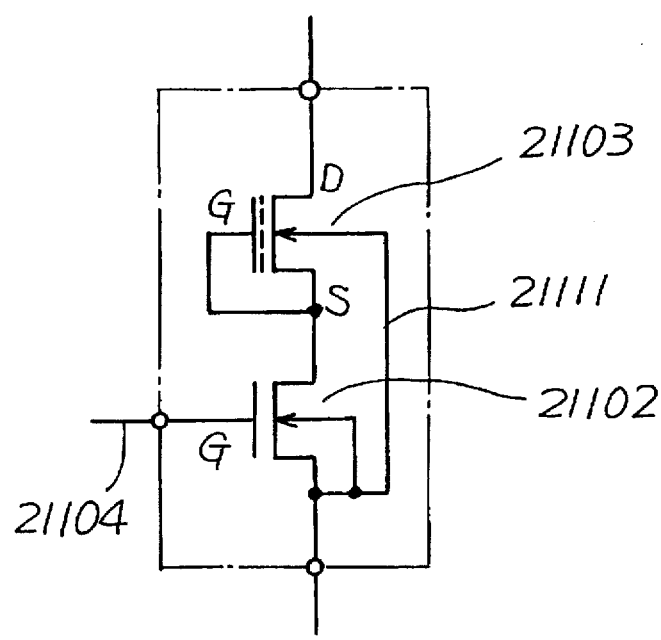
FIG. 35 is a circuit diagram showing a second realized example of the CRD with SW of the ninth embodiment of the present invention.

FIG. 35 is a circuit diagram showing a second realized example of the CRD with SW of the ninth embodiment of the present invention. The enhanced SW transistor may be disposed under (in terms of the direction of electricity or current) the depletion transistor as shown in the figure. When the CRD is used disposing under the load heading the Vdd as shown in FIG. 34 (referred to as a CRD grounding or generally also an open-drain), while the breakdown voltage VH (VAC) is almost doubled (in this case, 26 V×2=52 V) with the type in FIG. 33, VL becomes higher if a SW input ON level is not more than 3 to 5 V. In FIG. 34, an input SW voltage level is permissible if it is more than VTH of the enhanced transistor (0.5 to 0.8 V). However, although the breakdown voltage is almost doubled if the VAC (voltage shouldered between the anode and cathode) increases, a regulation current (Ireg.) is reduced due to a back-gate effect on the depletion transistor side. While it may be used as it is in contrary, a VSW (SW voltage) dependency is brought about in short. By any means, the CRD shown in FIGS. 33 and 34 performs enough functions as a semiconductor product corresponding to their uses.

Figure 36:
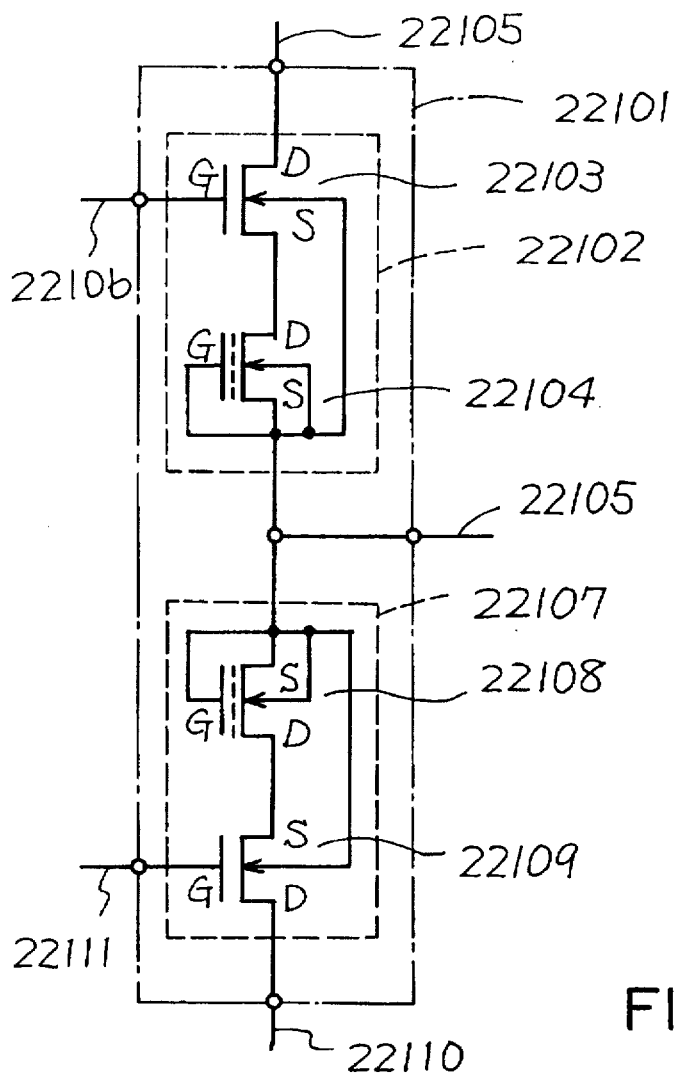
FIG. 36 is a circuit diagram showing a pair of CRDs with SW of the present invention according to a tenth embodiment of the present invention.

FIG. 36 is a circuit diagram showing a pair of the CRDs with SW (22101) according to a tenth embodiment of the present invention. The reference numeral (22105) denotes an output terminal of a first CRD, (22103) an enhanced transistor for SW of the first CRD, (22104) a current regulating depletion transistor of the first CRD, (22016) a a common terminal of the first and second CRDs, (22107) a region of the second CRD, (22108) a current regulating depletion transistor of the second CRD, (22109) an enhanced transistor for SW of the second CRD, (22110) an output terminal of the second CRD and (22111) a SW terminal of the second CRD. A state of the selection of drain fuses of the current regulating depletion transistor is omitted as usual.

Here a source of the enhanced transistor of the first CRD and a drain of the first depletion transistor, a source of the first depletion transistor and a source of the second depletion transistor and a drain of the second depletion transistor and a source of the second enhanced transistor may be shared respectively (by the same reason with the fifth and ninth embodiments) and the pair of CRDs with SW which is equivalent to four transistors may be realized with an area of about 2.5 times of that of the transistor in total.

Figure 37:
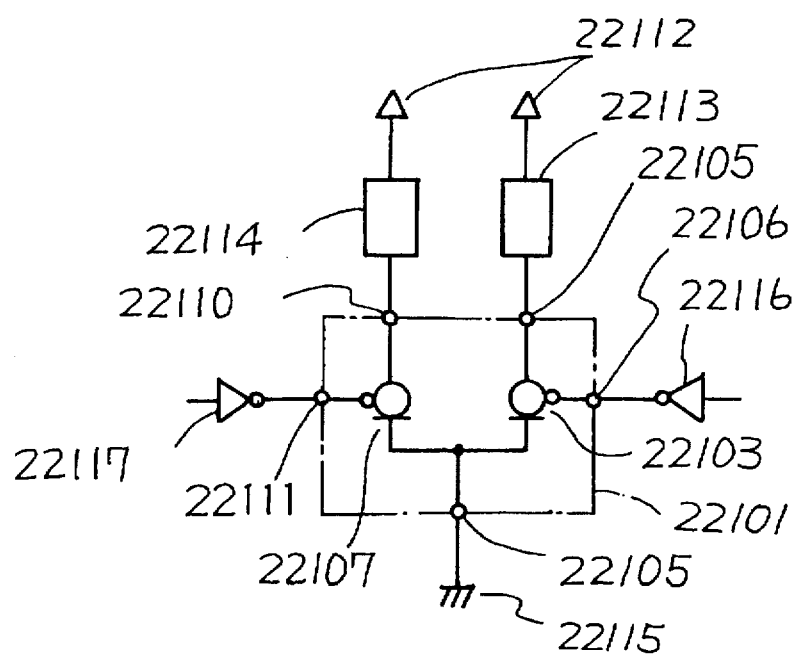
FIG. 37 is a circuit diagram showing the pair of CRDs with SW of the tenth embodiment of the present invention.

FIG. 37 is a circuit diagram showing the pair of CRDs with SW of the tenth embodiment of the present invention. The reference numeral (22112) denotes a Vdd, (22113 and 22114) different loads, (22116 and 22117) different external SW signal circuits and (22115) a GND. Values of the regulated current of the first CRD and second CRD may be set at different values respectively and it is possible and is useful to drive loads having different currents.

Figure 38:
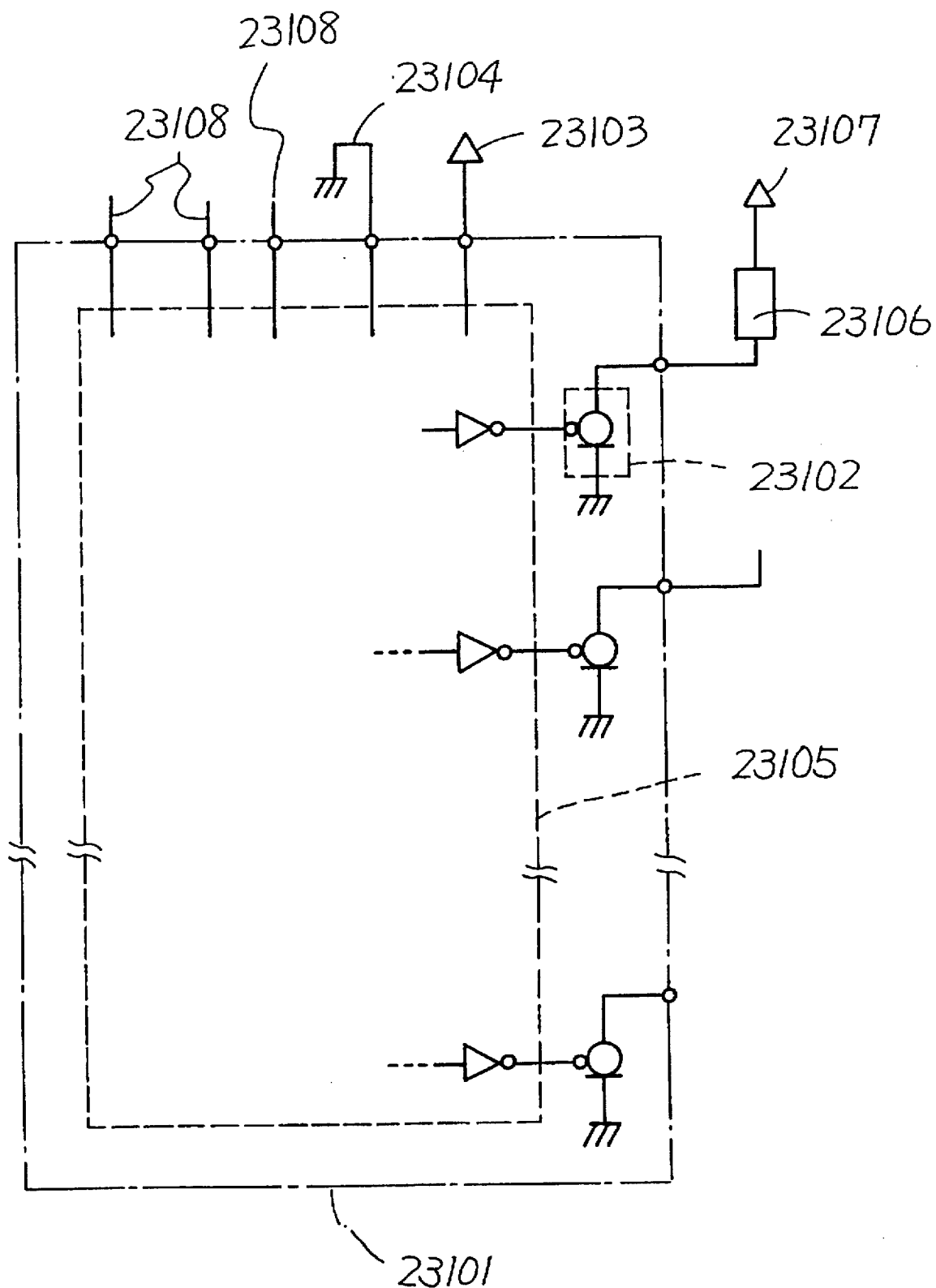
FIG. 38 is an explanatory diagram showing a circuit of a semiconductor integrated circuit device having many CRDs with SW of the present invention at an output terminal according to an 11-th embodiment of the present invention.

Although not shown, an useful semiconductor integrated circuit device may be realized by arranging them on the same substrate as a set of four, set of six, . . . in the same manner. FIG. 38 is an explanatory diagram showing a circuit of a semiconductor integrated circuit device (23101) having many CRDs with SW of the present invention at an output terminal according to a 11-th embodiment of the present invention. The CRD with SW 23102 of the present invention is connected with an external load 23106 linked with an external separate power source Vdd 23107 while being grounded within the semiconductor integrated circuit device of the present embodiment. ON/OFF of the SW is controlled by an internal circuit 23105 (not shown) structured by such shift registers as shown with reference to the eighth embodiment. The reference numeral (23103) denotes a Vdd, (23104) a GND and (23108) an input terminal, respectively.

Figure 39:
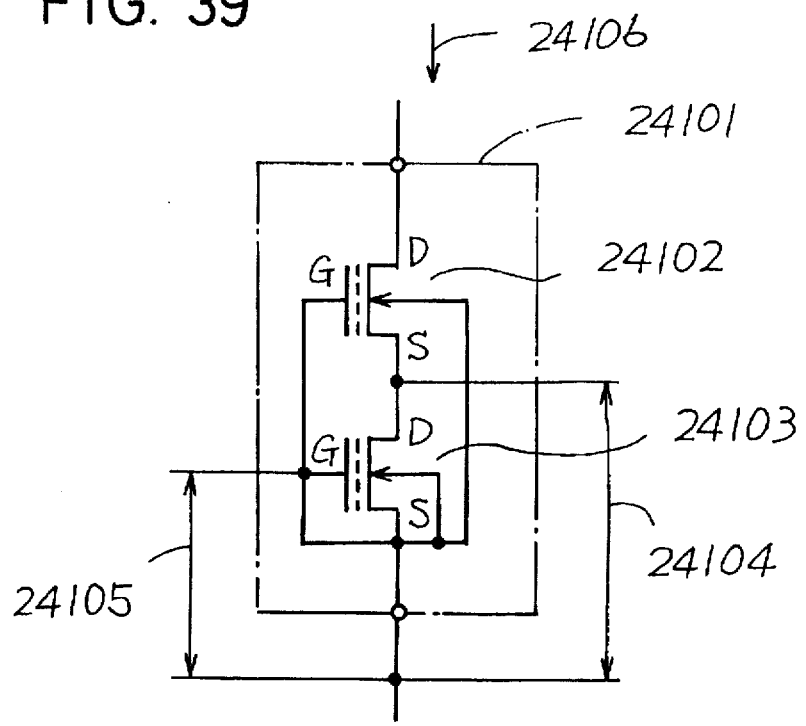
FIG. 39 is a circuit diagram showing an equivalent circuit of the CRD according to a 12-th embodiment of the present invention.

FIG. 39 is a circuit diagram showing an equivalent circuit of a CRD according to a 12-th embodiment of the present invention. It is constructed by connecting in series a transistor 1 (24103) having a threshold voltage of a first depletion (referred to as V TND1) and a transistor 2 (24102) having a threshold voltage of a second depletion (referred to as V TND 2). The V TND2 shall have a deeper depletion than that of the V TND1 as described later). Gates are both connected to a substrate. When W/L of the transistor $1=W_1/L_1$ and W/L of the transistor $2=W_2/L_2$, a current $I_1$ ($=I_2$) 24106 may be expressed as follows:

$$I_1 = \frac{\mu C_{ox} W_1}{L_1} (V_{g24106} + |V\,TND1|)^2 \quad (1)$$

and $$I_2 = \frac{\mu C_{ox} W_2}{L_2} (V_g - V_{o24104} + |V\,TND1|)^2 \quad (2)$$

where μ is a mobility of carriers and Cox is a capacity of channel. Because $I_1=I_2$ and Vg=0, $$\frac{W_1}{L_1}(|V\,TND1|)^2 = \frac{W_2}{L_2}(|V\,TND2| - V_0)^2 \qquad (3)$$

When $L_1 = L_2$ and $W_1 = W_2$,
V TND1=V TND2–Vo
Therefore, Vo=|V TND2|–|V TND1|. That is, Vo is clamped by a voltage determined by V TND. Accordingly, a channel length is not modulated and L may be set shorter. L may be set as 6, 4 or 3μ. The V TND2 may be a value about a twice of an absolute value of the V TND1. Because L may be shorter, W may be also shorter that much and the increase of area caused by the fabrication of two transistors may be considerably reduced by sharing the drain region of the transistor 1 and the source region of the transistor 2 as described before. In the figure, a state of trimming of drain fuses is omitted to simplify the figure.

Figure 40:
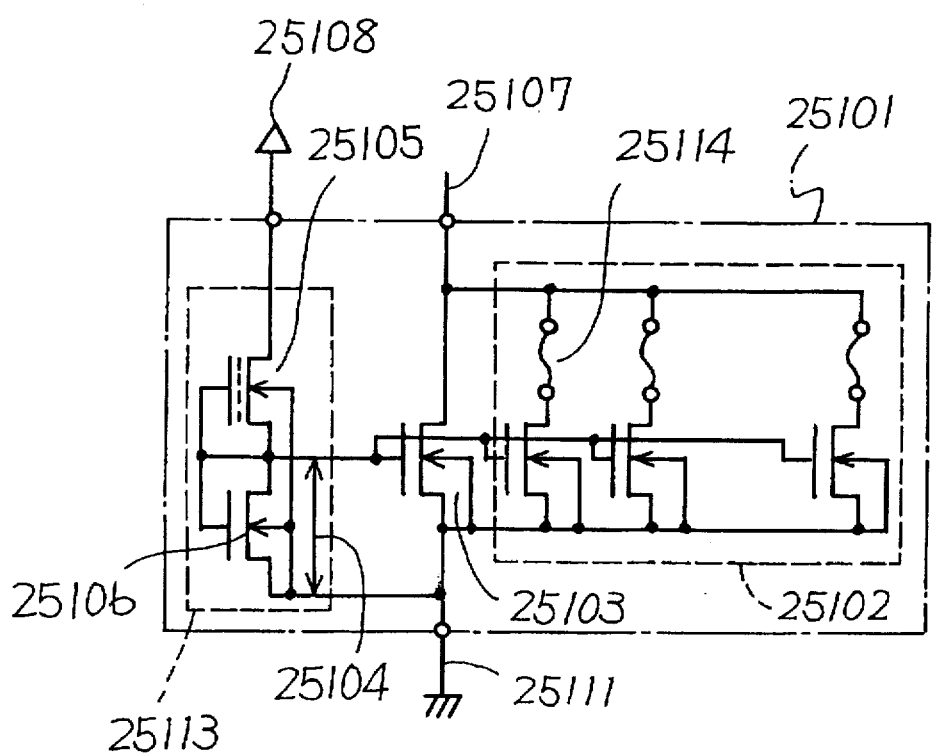
FIG. 40 is a circuit diagram showing an equivalent circuit of the CRD according to a 13-th embodiment of the present invention.

FIG. 40 is a circuit diagram showing an equivalent circuit of a CRD (25101) according to a 13-th embodiment of the present invention. An enhancement type NMOS transistor 25106 and a depletion type NMOS transistor 25105 are connected to a separate voltage Vdd1 25108 to form a reference voltage section (Vref section) 25113 and a reference voltage (V ref) 25104 biases gates of a NMOS transistor for driving regulated current 32103 and a plurality of transistors shown by 25102 (hereinafter the transistors 25103 and 25102 are referred to as transistors for driving regulated current). A regulated current may be obtained at the transistor 25103 having a first width and at the arrayed transistor region 25102 having a second drain width (multiple number; in the manner of the present invention described before). While the basic structure is not different from the essence of the present invention, the point of the present embodiment is that the gate of the transistor where the regulated current passes is biased by Vref. While Vref is a constant voltage and the transistor 25103 is driven (turned ON), the second drain width is selected by a fuse 25114 similarly to the aforementioned embodiments of the present invention because the constant voltage (Vref) value and gm of the transistor 25103 fluctuate. The present embodiment has such merits that a larger drain current may be obtained and the chip size (area of element) may be reduced because the transistor for driving regulated current is driven by the Vref structured by the separate power source.

When the NMOSs 25103 (including the transistor 25102 of course) and 25106 have gate oxide films having a thickness of 500 angstrom and are P-type substrates of 2.5Ω.cm, an initial (native) V TH (referred to as V TN1) becomes 0.2 V (center). Assuming that –0.5 V of V TND is obtained by means of channel doping of N-type impurities, 0.7 V which is about |V TN1|+|V TND| is generated at the Vref, allowing to fully drive the transistor 25103 having 0.2 V of V TH.

Favorable characteristics having less leak may be obtained by means of channel doping of P-type impurities, not by the V TN1 and by using 0.3 to 0.4 V of V TN1 and V TH (referred to as VTNH) for 25106 or 25103. In this case, while Vref=0.3+|–0.5|=0.8 V when V TNH is 0.3 V, the chip size may be reduced further due to the current driving ability by setting 25016 as V TN1 or V TNH and 25013 as V TND.

FIG. 41 is an explanatory diagram showing a circuit wherein the CRD of the 13-th embodiment of the present invention is actually used. In the present embodiment, the CRD 25101 connected to a GND 25112 is connected to an external power source Vdd2 25109 to be connected and used with an external load 25110.

FIG. 42 is an explanatory diagram showing a circuit wherein the CRD of the 13-th embodiment of the present invention is actually used and applied. As a SW terminal, the Vdd1 terminal 25108 can operate the CRD. When a SW control signal such as H (Hi, high level signal, 0.8 to 5 V, or possibly 12 V or 24 V) is supplied with a logic in TTL or CMOS level (inverter 25115) for example, the Vref circuit is operated and the CRD is turned ON and is functioned. At this time, the external signal suffices provided that it has a current driving ability of more than several hundreds nA in H level. The CRD is turned OFF when L (Lo, low level, GND) signal is supplied. At least the transistor for driving regulated current must be the enhancement type when such function is to be performed.

It is needless to say that the structure in which Vdd itself (or what described as Vdd1 and the like) for the Vref circuit (and what referred to as a differential amplifier for an error amplifying circuit described later) is used as the SW terminal of the CRD is similarly effective in the embodiments described hereinafter.

FIG. 43 is a circuit diagram showing an equivalent circuit of a CRD (26101) according to a 14-th embodiment of the present invention. Each transistor in an area 26102 of arrayed transistors having a second drain width variation has a fuse for gate-on 26105 connected to Vref and a fuse for gate-on 26103 connected to GND at its gate terminal and is arranged in such manner of trimming as described before that a gate-off fuse is cut for a selected drain width, a gate-on fuse is cut for a drain width not used as it is and the gate-off fuse is broken down to GND and is turned off as it is. Because there is no series resistance in the drain (polysilicon fuse), a more flat regulated current characteristic (VAC dependency) may be obtained.

Figure 44:
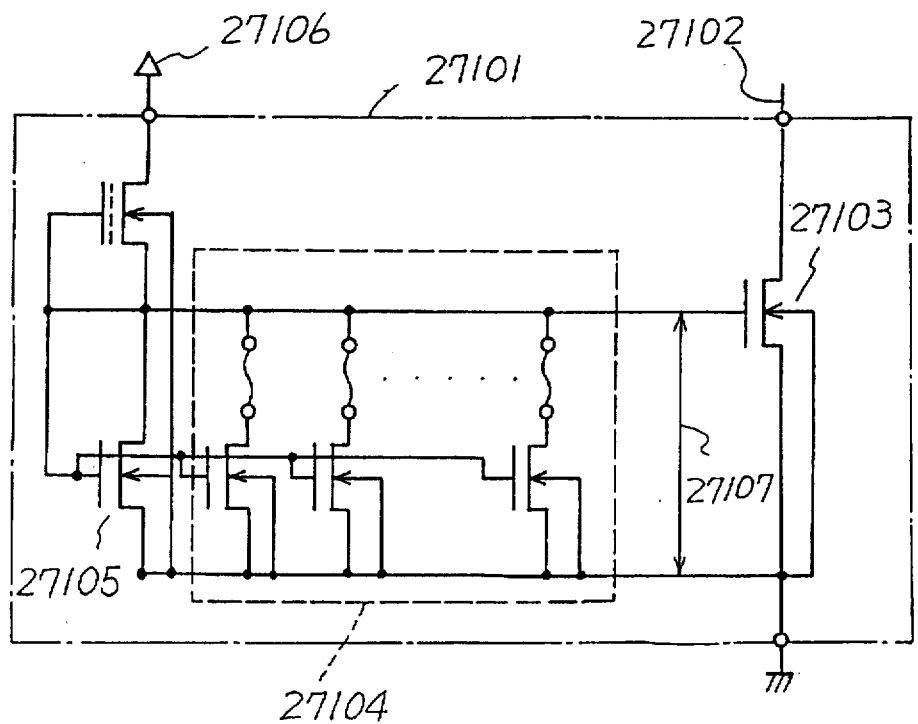
FIG. 44 is a circuit diagram showing an equivalent circuit of a CRD according to a 15-th embodiment of the present invention.

FIG. 44 is a circuit diagram showing an equivalent circuit of a CRD (27101) according to a 15-th embodiment of the present invention. The enhanced type NMOS transistor composing the Vref circuit is constructed by a transistor 27105 having a first drain width and a transistor area 27104 in which a plurality of drain widths having a $X^n$ weigted variation as described before are arrayed and fluctuation of regulated current of a transistor for output 27103 is finely trimmed and adjusted to match accurately. Although the drain is selected in this embodiment, the gate may be selected similarly to the 14-th embodiment.

Because the area of the transistor for Vref is small originally as compared to the transistor for output, the CRD having even less area (chip size) may be constructed by adopting such arrangement. The reference numeral (27102) denotes an output terminal and (27106) a Vdd terminal.

Figure 45:
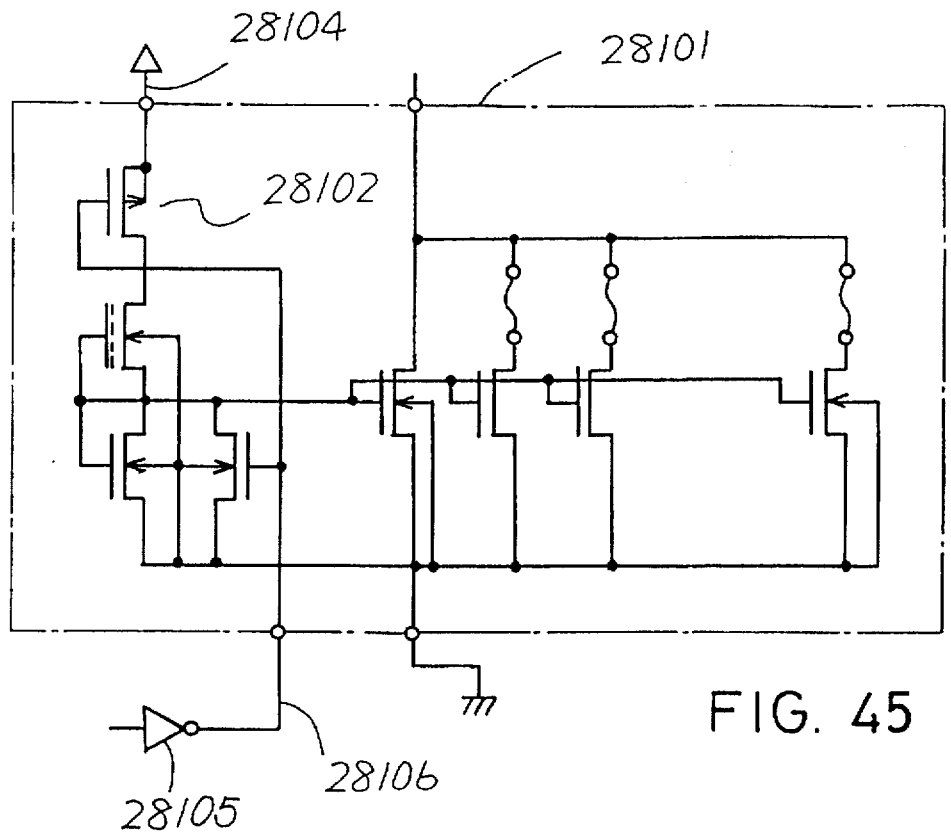
FIG. 45 is a circuit diagram showing an equivalent circuit of a CRD according to a 16-th embodiment of the present invention.

FIG. 45 is a circuit diagram showing an equivalent circuit of a CRD (28101) according to a 16-th embodiment of the present invention. This is a case wherein a CRD having a SW terminal 28106 beside a Vdd terminal is constructed by providing a P-channel type MOS (PMOS) transistor for SW 28102 and a NMOS transistor for SW 28103.

Such arrangement is made that when an external signal 28105 is Lo, the CRD is ON and when the signal is Hi, the CRD is OFF. As shown, in detail with reference to a 17-th embodiment, because Vdd of the Vref section is common in the case of the CRD having a plurality of outputs, SW may be conveniently provided for each output by thus providing the SW beside the Vdd. Although the selection is made on the drain fuses in the regulated current characteristic in the figure of the present embodiment, it may be the selection on gates or selection on enhanced transistors of the Vref as described before.

Figure 46:
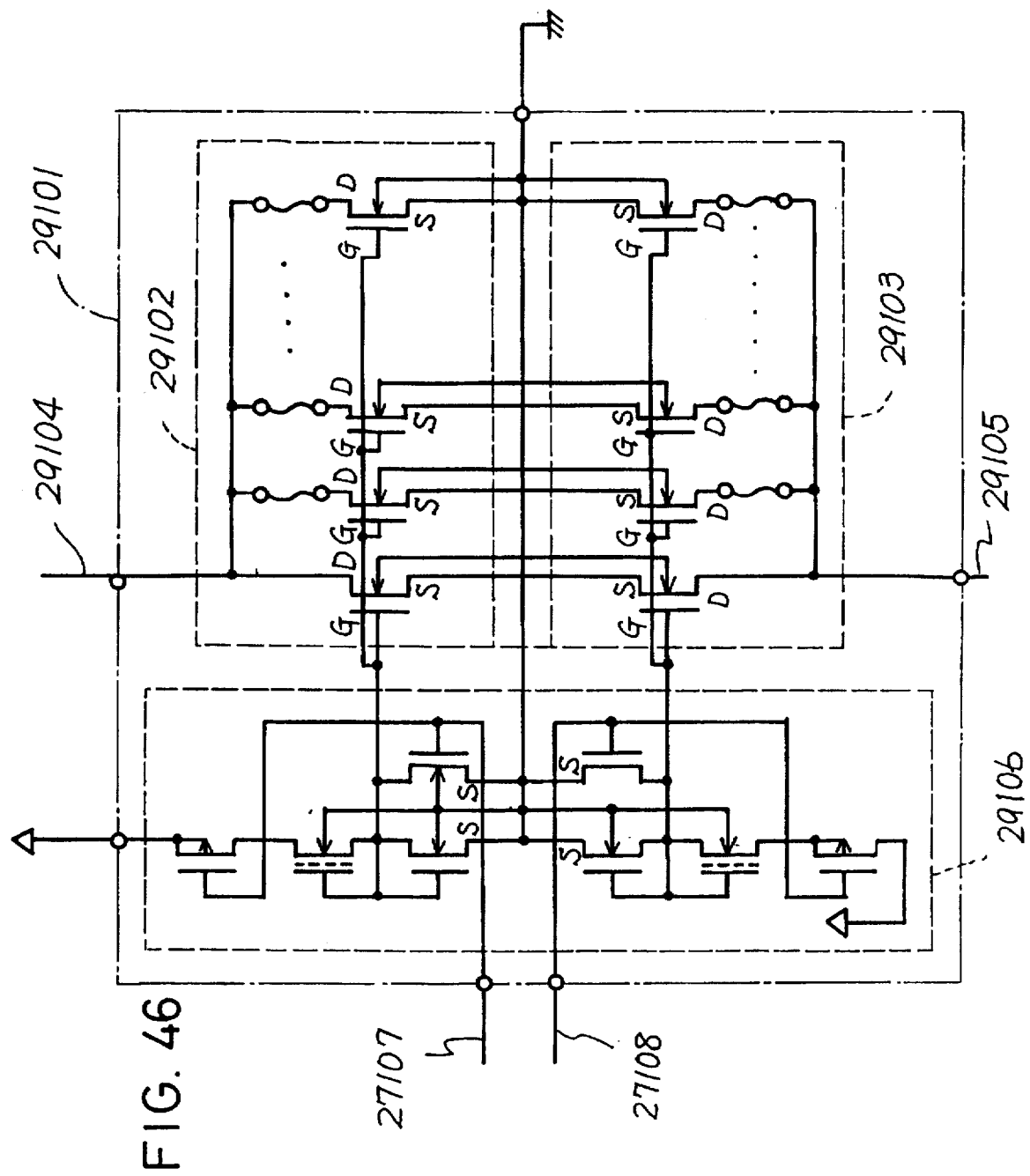
FIG. 46 is a circuit diagram showing an equivalent circuit of a CRD according to a 17-th embodiment of the present invention.

FIG. 46 is a circuit diagram showing an equivalent circuit of a CRD (29101) according to the 17-th embodiment of the present invention. This is a case wherein two CRDs are integrated.

A first current regulating section (CRD section) 29102 and a second current regulating section 29103 has a Vref circuit 17109 and SW terminals 27107 and 27108, respectively. The first CRD section and second CRD section may have each different set current or may share the Vref section and SWs as one. An area may be reduced by sharing a current driving section and a source of NMOS of the Vref section of the first CRD with those of the second CRD as described before. The reference numeral (29104) denotes an output terminal of the first CRD and (29105) an output terminal of the second CRD.

Figure 47:
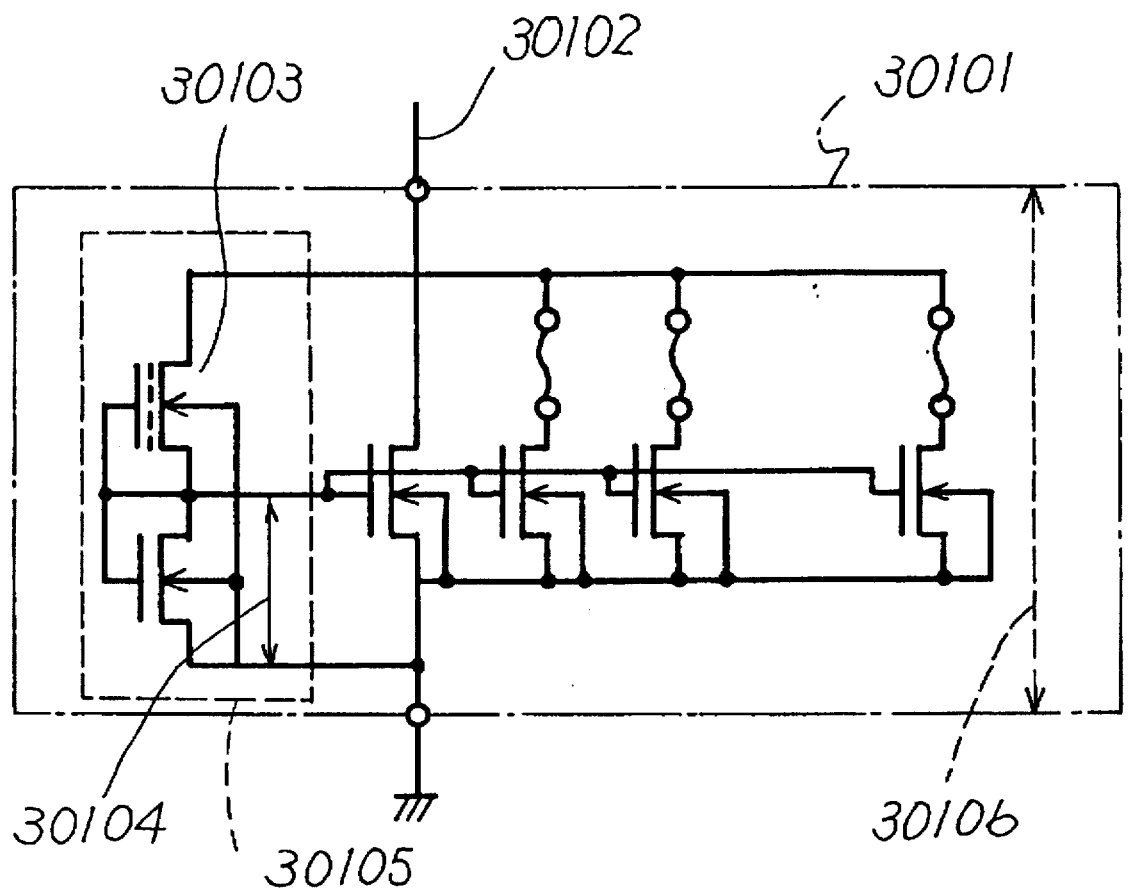
FIG. 47 is a circuit diagram showing an equivalent circuit of a CRD according to a 18-th embodiment of the present invention.

FIG. 47 is a circuit diagram showing an equivalent circuit of a CRD (30101) according to a 18-th embodiment of the present invention. A Vdd power source of a Vref circuit section 30105 is supplied from an output terminal 30102. When a voltage between anode-cathode V AC 30106 becomes more than 0.9 V, the Vref circuit section operates normally and the current regulating section also operates. This is a system in which an output current regulating transistor is driven by Vref which allows to construct a two-terminal CRD. Although the selection is made on the drain fuse in the current regulating characteristics in the diagram of the present embodiment, it may be the selection on gate or on enhanced transistor as described before. The reference numeral (30104) denotes an enhanced transistor and (30103) a depletion transistor. It is also possible to attach a SW terminal by providing a PMOS or NMOS like in the 16-th embodiment.

Figure 48:
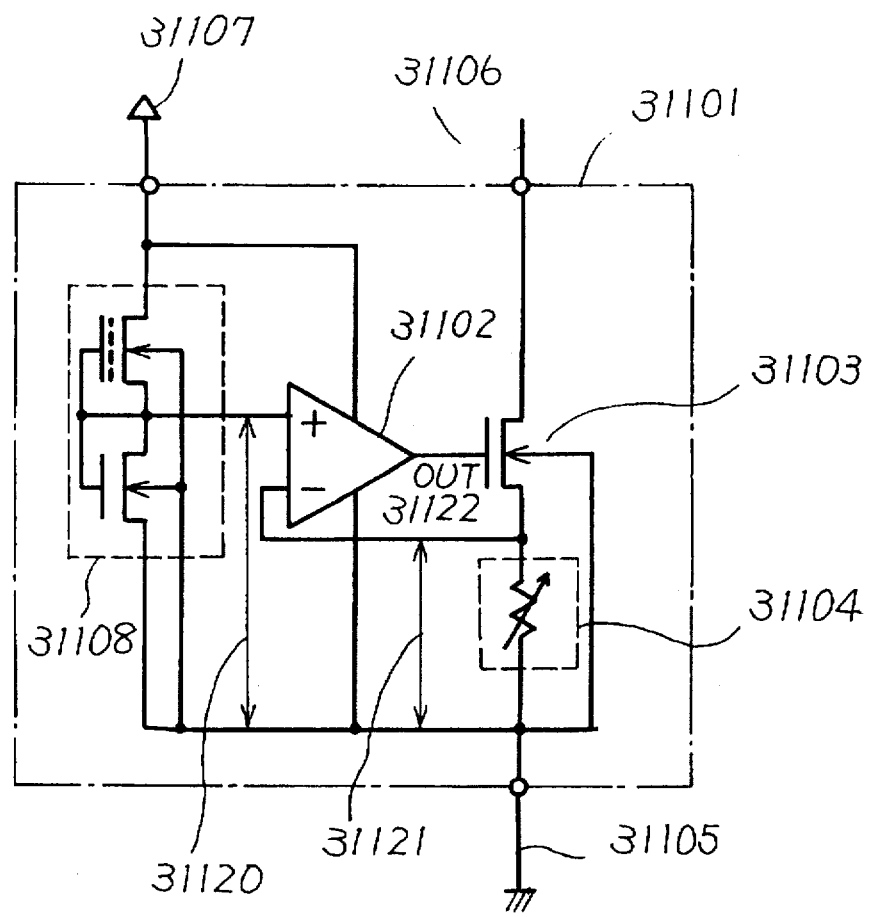
FIG. 48 is a circuit diagram showing an equivalent circuit of a CRD according to a 19-th embodiment of the present invention.

FIG. 48 is a circuit diagram showing an equivalent circuit of a CRD (31101) according to a 19-th embodiment of the present invention. A series resistance (which may be a poly-silicon resistance or the like) 31104 is connected to an output transistor 31103, a Vref voltage from a Vref circuit section is input to a differential amplifier 31102 comprising a CMOS and a potential between the resistance 31104 and the transistor 31103 is input to the differential amplifier 31102 as a feedback voltage V FB 31121. That is, a regulated current may be obtained when the V FB rises when a current flows in the resistance and the differential amplifier reduces a voltage at a voltage OUT terminal 31122 driving the transistor 31103. Because the initial current value fluctuates due to various factors, the series resistance 31104 is an essence of the present invention and is arranged by the $X^n$ weighted trimming as described before.

When Vref is 0.8 V and Ireg (regulated current value)=10 mA, the series resistance is set at about 80 Ω (center). The reference numeral (31107) denotes a Vdd terminal, (31106) an output terminal and (31105) a GND terminal. Although the Vref using the Vdd has been used in the present embodiment, it is of course useful to combine with the various measures described in the aforementioned embodiments.

Figure 49:
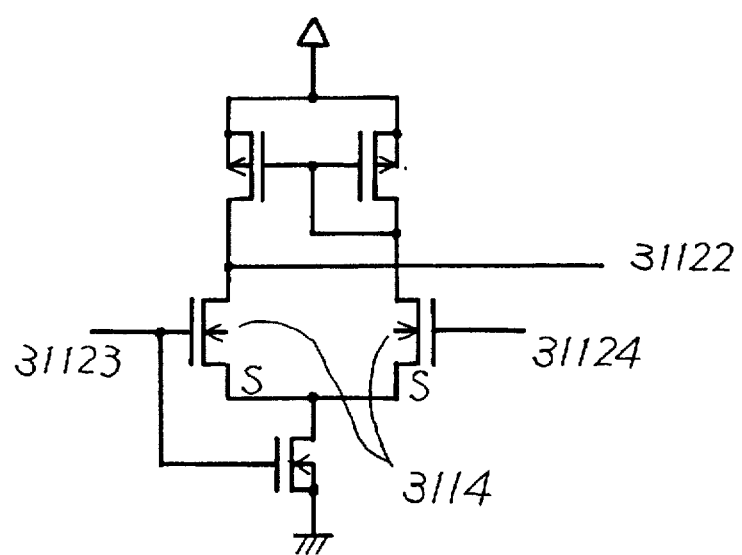
FIG. 49 is a circuit diagram showing an internal equivalent circuit diagram of a differential amplifier of the 19-th embodiment of the present invention.

FIG. 49 is a circuit diagram showing an internal equivalent circuit diagram of the differential amplifier in the 19-th embodiment of the present invention. Although a substrate 3114 of the NMOS transistor becomes GND if the integrated circuit of the present invention is composed of a P-type semiconductor and it is connected to a source of each if the circuit is composed Of a P-type well which is not the GND in a N-type semiconductor substrate (connecting lines are omitted), there is no problem in terms of its operation. The reference numeral (31124) denotes a minus terminal and (31123) a plus terminal and (+) and (−) in the differential amplifier are indicated as usual.

FIG. 50 is a circuit diagram showing the trimming structure of the series resistance of the 19-th embodiment of the present invention. The resistances $R_1$ 3110, $R_2$ 3111, $R_3$ 3112, . . . $R_n$ 3113 has a fuse 31109 respectively and are connected in series. They are weighted by $R_n=R_0\times 2^n$, n=0, 1, 2, . . . n−1 and are selected and matched to a desired current regulating value.

FIG. 51 is a circuit diagram showing a second example of the trimming structure of the series resistance of the 19-th embodiment of the present invention. This structure has been explained in detail in the previous stage of the present invention.

FIG. 52 is a circuit diagram showing a third example of the trimming structure of the series resistance of the 19-th embodiment of the present invention. For example, a part 1 is a variation for selecting a type of product (Ireg=10 mA product, 20 mA product or 50 mA product) and a part 2 is a variation for trimming fluctuations.

Figure 53:
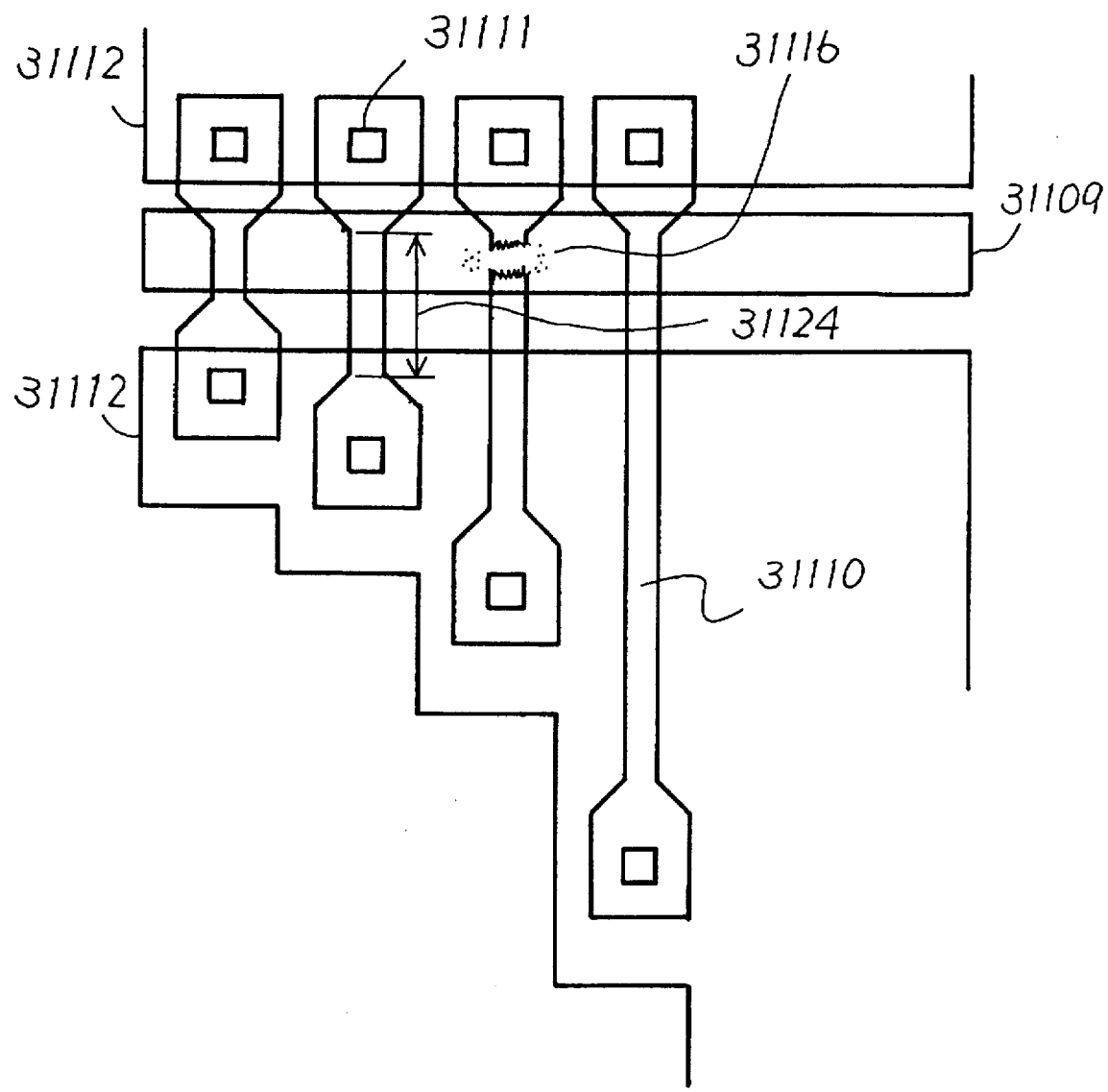
FIG. 53 is a plan view showing a state of the trimming of the series resistance of the 19-th embodiment of the present invention.

FIG. 53 is a plan view showing a state of the trimming of the series resistance of the 19-th embodiment of the present invention. The structure of the circuit is what in FIGS. 51 and 52. The series resistance itself is a poly-silicon fuse 31110 and the resistance value is weighted by the length of poly-silicon L31124 as shown in the figure. The reference numeral (31116) shows a state wherein the fuse is trimmed by laser and (31111) denotes a contact hole, (31112) an Al electrode and (31109) a passivation opening section.

Figure 54:
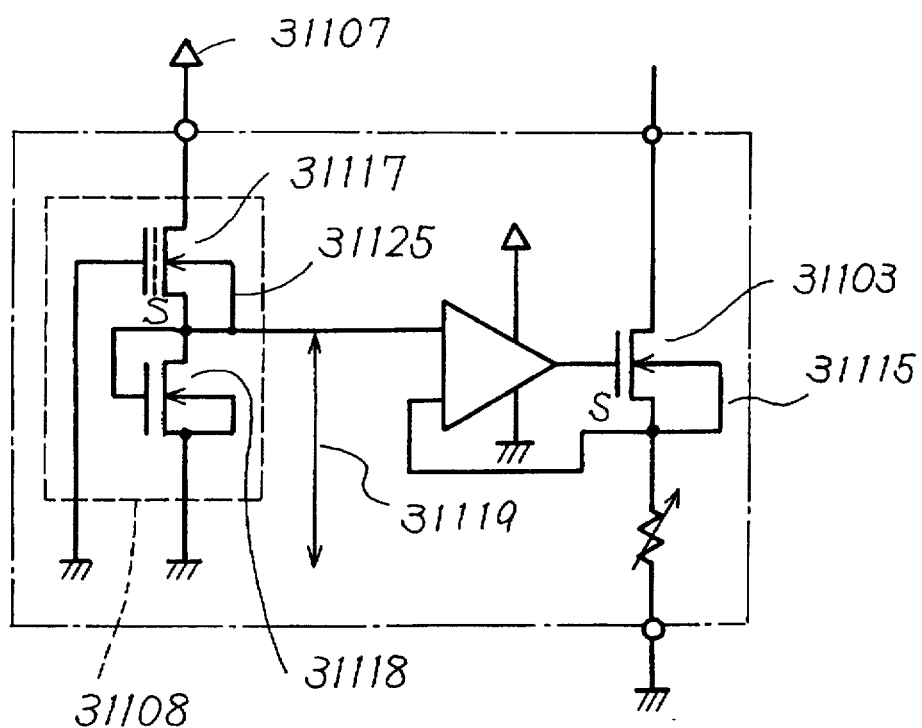
FIG. 54 is a circuit diagram showing a constant voltage type equivalent circuit of the CRD of the 19-th embodiment of the present invention.
Figure 55:
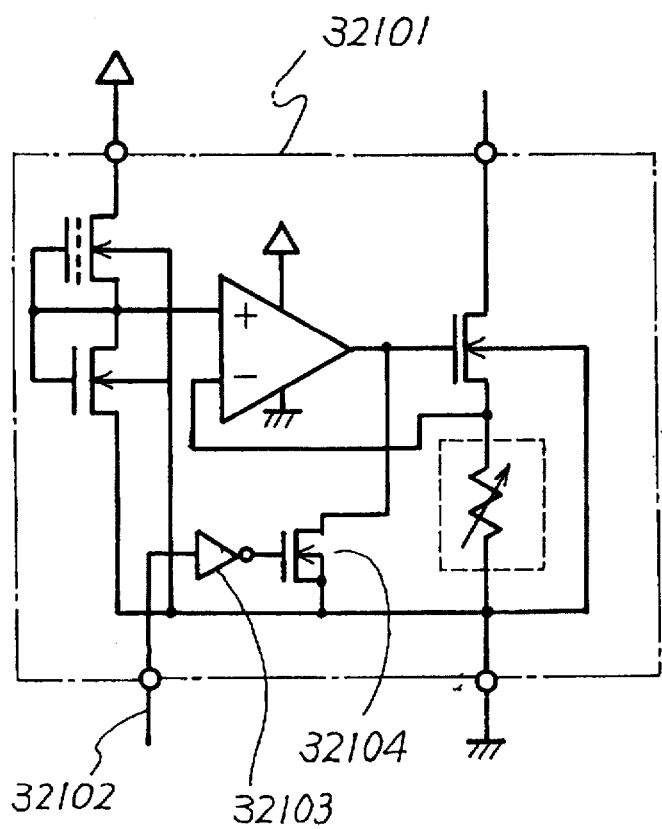
FIG. 55 is circuit diagram showing an equivalent circuit of a CRD according to a 20-th embodiment of the present invention.

FIG. 54 is a circuit diagram showing a constant voltage operation type equivalent circuit of the CRD of the 19-th embodiment of the present invention. When a separate P-well is provided within a N-type semiconductor substrate to structure a CMOS type integrated circuit to turn a gate of a depletion transistor 31117 in a Vref circuit section 31108 into a GND and when the P-well substrate 31125 is connected to its source, Vref=0.4 V may be obtained when V TH of an enhanced transistor 31118 is 0.3 V and V TH of the transistor 31117 is −0.5 V, allowing an operation of a Vdd1 31107 for outputting normal Vref from 0.8 V. Further, when constructed like this, a substrate 31115 of the output transistor 31103 may be also connected to the source, allowing to obtain a better current regulating characteristic (the V AC dependency becomes low). FIG. 55 is circuit diagram showing an equivalent circuit of a CRD (32101) according to a 20-th embodiment of the present invention. This is a CRD containing such differential amplifier as described with reference to the 19-th embodiment, wherein a NMOS for SW 32104, inverter 32103 and SW terminal for ON/OFF 32102 are provided. Although the CMOS inverter may be readily contained because the differential amplifier is a CMOS, it needs not to be provided if it is desirable to change the order of ON/OFF or it is possible to add one in series. In relation to the type of CRD containing the differential amplifier described in the 19-th and 20-th embodiments, it may be constructed like an IC containing two to a plurality of amplifiers similarly to the other embodiments.

Figure 56:
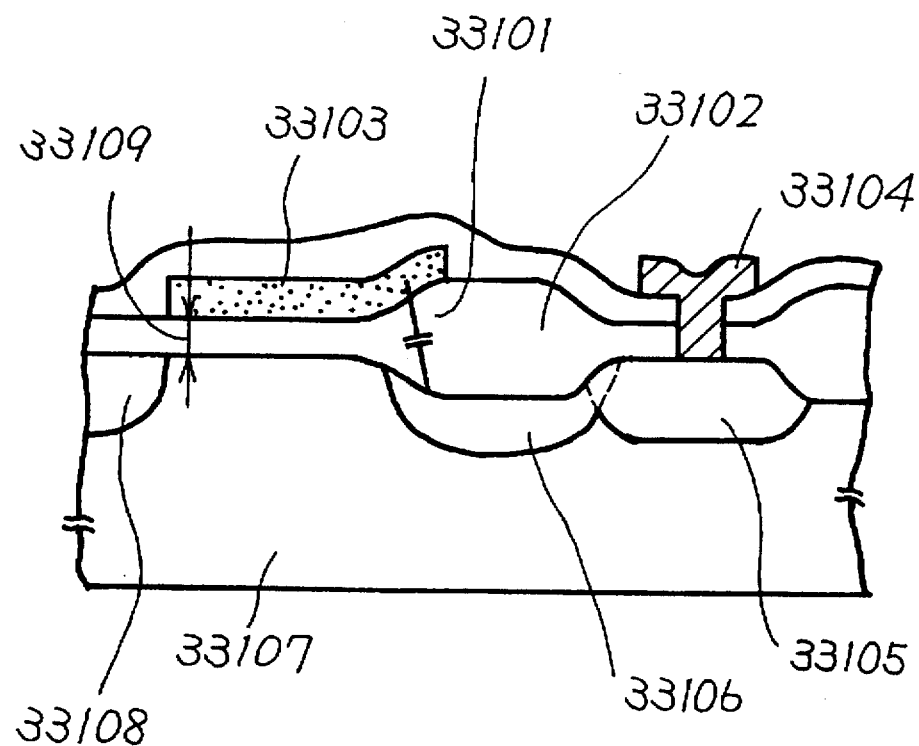
FIG. 56 is a section view of a NMOS transistor composing a CRD according to a 21-st embodiment of the present invention.

FIG. 56 is a section view of a NMOS transistor composing a CRD according to a 21-st embodiment of the present invention. The present embodiment is related to all the embodiments described so far and to the structure of the transistors which are elements for constructing the output and other CRDs. An end of a poly-silicon gate electrode 33103 is laid on a part of a LOCOS oxide film more than 1μ μm and is laid on a N± type drain region (field doped drain, formed by introducing about 1 to $3\times 10^{18}$ atoms/cm$^3$ of N-type impurities). By doing so, a breakdown voltage at a gate end of the drain, i.e. so-called a drain breakdown voltage (surface breakdown voltage, gate aided, drain breakdown voltage) may be improved. That is, a CRD having 24 V of VH may be realized and in the same time, it can accommodate with a high-speed operation because a capacitance 33101 between the gate and drain can be reduced. The reference numeral (33107) denotes a P⁻ type substrate (a substrate of 2 to 3 Ω.cm or about 2.5 Ω.cm), (33105) a N⁺ type drain region, (33104) a drain electrode, (33108) a N⁺ type source region and (33109) a thickness of a gate oxide film which is 500 angstrom. Such structure is called a LOCOS drain structure.

Figure 57:
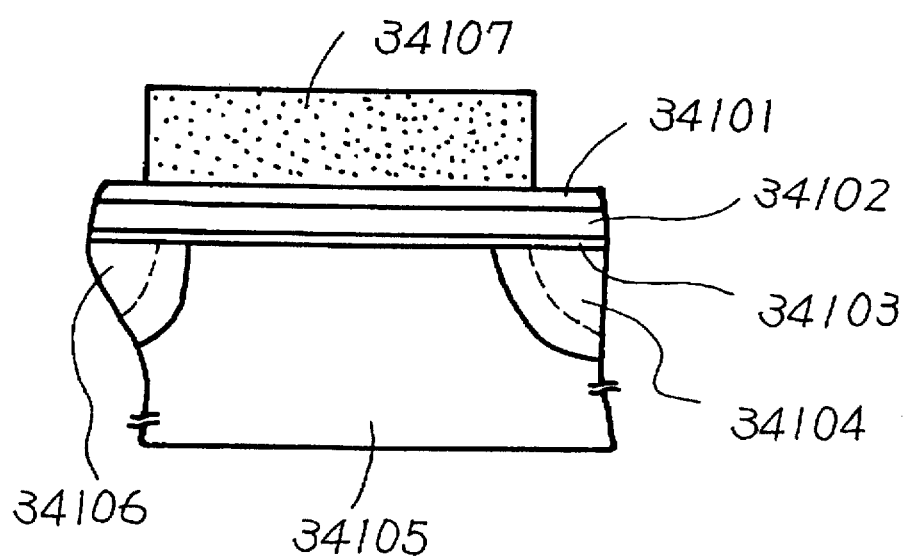
FIG. 57 is a section view of a NMOS transistor composing a CRD according to a 22-nd embodiment of the present invention.
Figure 58:
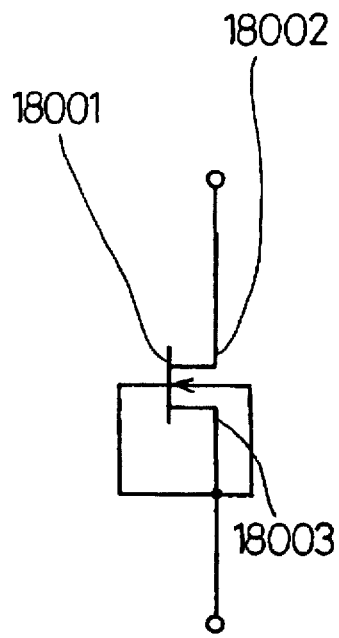
FIG. 58 is an explanatory diagram showing an electrical function of a prior art CRD.
Figure 59:
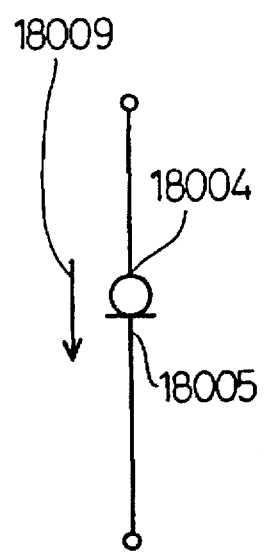
FIG. 59 is an explanatory diagram showing an electrical function of the CRD.
Figure 60:
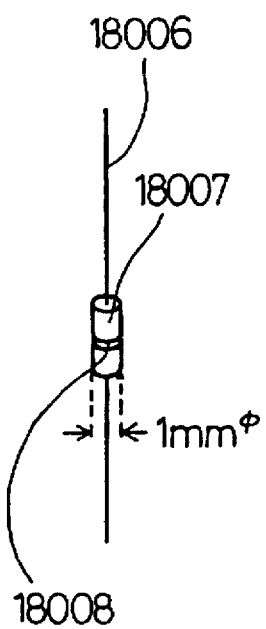
FIG. 60 is an outside view of the prior art CRD.
Figure 61:
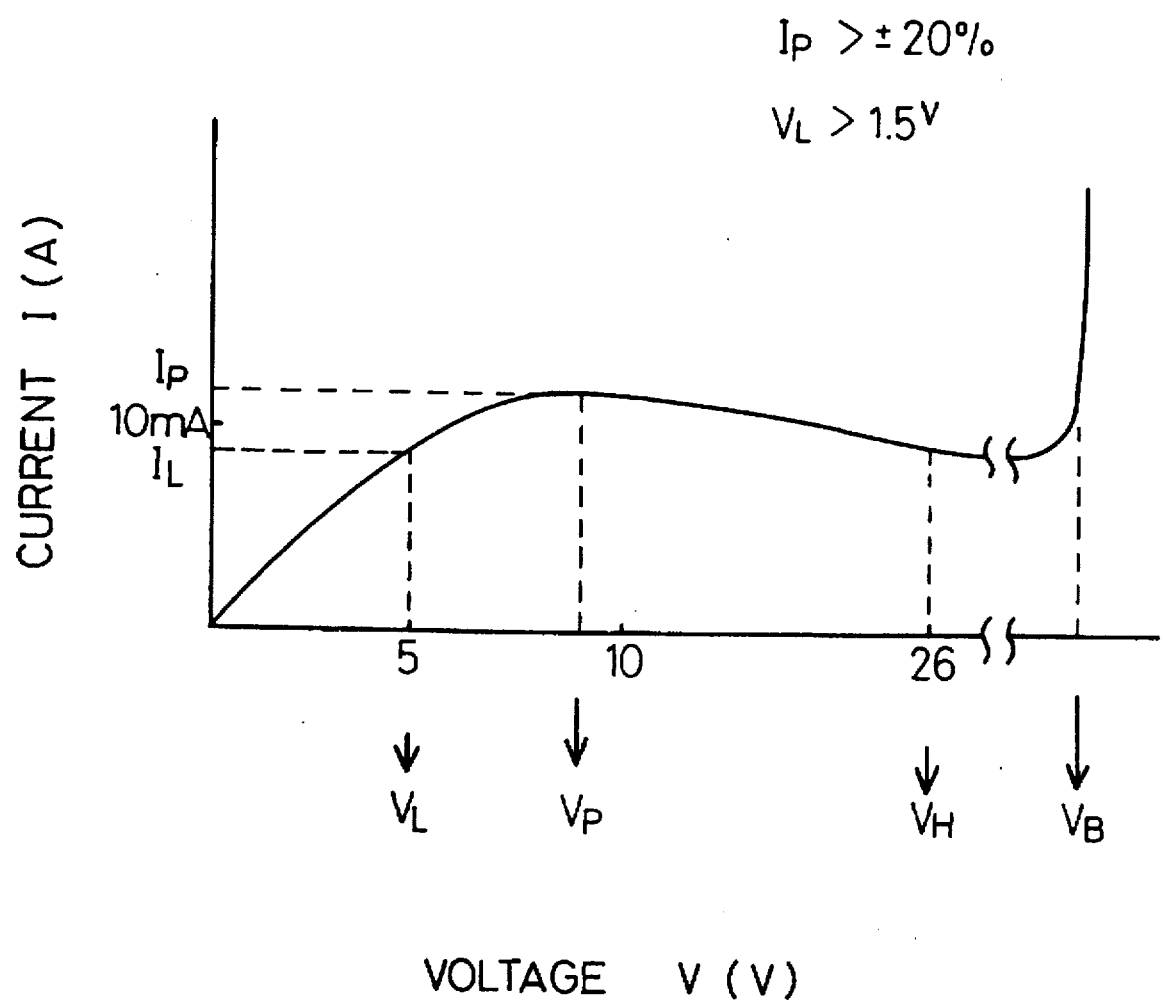
FIG. 61 is a graph showing voltage-current characteristics of the prior art JFET CRD.

FIG. 57 is a section view of a NMOS transistor composing a CRD according to a 22-nd embodiment of the present invention. The present embodiment is related to all the embodiments described so far and to a structure of the transistors which are elements for constructing the output and other CRDs. The gate oxide film takes a three-layered structure of SiN (silicon nitride film)-SiO₂-SiN, or so-called an ONO structure. By doing so, the ONO structure allows to reduce the chip size because a current value of the transistor for output is:

$$Id \propto \mu \cdot Cox \cdot \frac{W}{L} \cdot f(Vg, Vd, VTH, \ldots) \qquad (4)$$

and Cox becomes greater and Id can be large provided that the thickness of the films is the same (in terms of the breakdown voltage and TDDB). In more detail, it is desirable in terms of a balance of breakdown voltage, drivability and others to structure the transistor comprising about 100 angstrom of a ground SiO₂ (34103), about 300 angstrom of SiN (34102) and about 100 to 200 angstrom of a CVD film or HTO film formed by CVD in 600° to 900° C. for a top SiO₂ (34101). The reference numeral (34105) denotes a P⁻ type substrate (34104 and 34106) source and drain regions and (34107) a poly-silicon gate electrode.

Now a 23-rd embodiment of the present invention will be explained. Although the present embodiment is related to all the embodiments described so far and to the thickness of the gate oxide film, it is not shown as a figure because it is a numerical matter.

In a case of CRD with 24 V of VH, although more than 800 angstrom which is a value obtained by dividing 24 V with an electric field of 3 MV/cm is necessary considering the thickness of the gate oxide film TDDB according to the conventional MOSIC concept, a film thickness which allows to maintain the drain breakdown voltage (surface breakdown) suffices in the case of the CRD of the present invention because a voltage of only VTH+α is applied between the gate and transistor substrate, though 28 to 30 V of drain breakdown voltage is necessary. However, because Di for included ESD (junction) is 28 V as described before, while there is not enough margin with 10 MV to prevent the breakdown at this time, the minimum thickness of 350 angstrom is enough with 8 MV/cm.

Accordingly, a setting range of the thickness of the gate film is in between 350 to 600 angstrom in the present invention. Further, when the differential amplifier is included and a separate Vdd is provided to operate in the embodiment of the present invention and when 24 V is brought about at the Vdd, 3 MV needs to be assured with 24 V, i.e. more than 800 angstrom of thickness needs to be assured for all the transistors of the CMOS composing the differential amplifier. However, the transistor for output may be that guarantees 24 V of VH or of thickness of 350 to 600 angstrom and the drain breakdown voltage may be maintained by the LOCOS drain structure in the 21-st embodiment or the DDD structure described before also in this case.

ADVANTAGEOUS EFFECTS OF THE INVENTION

As described above, the CRD of the semiconductor integrated circuit device is constructed by the depletion type N-channel MOS transistor in which gate, source and substrate are electrically connected. The gate insulating film is set at less than 500 angstrom, a channel length of the gate (L length) is set at more than 8 μm. When it is desired to reduce V TH of depletion of the channel to less VL=1.5 V for example, it is set at less than −0.9 V and when it is desired to reduce it less than VL=1.0 V, it is set at less than −0.8 V. It has a drain region Having a channel of a first W width which corresponds to IP which is insufficient to a desired IP and a second drain region having channels of a second W width wherein there are a plurality of types channel W widths which are selected as necessary to be connected with the first drain in parallel. Here those plurality of types of W widths take a dimensional ratio of $X^n$. Here, X is set as a numerical value greater than 1.0 and n is set as a value greater than 1.0. Thereby, it allows to match completely to the desired IP within ±1 to 5%. Thereby it allows to realize the very high performance and low cost CRD without dropping the yield, increasing the chip size and increasing an unnecessary stock for the first time.

What is claimed is:

1. A semiconductor integrated device comprising: a semiconductor substrate; and at least one current regulating diode comprising a plurality of depletion mode MOS transistor formed in the semiconductor substrate, each MOS transistor including a gate, a source region, a drain region and a substrate region, the gate, the source region and the substrate region of each MOS transistor being electrically coupled, and wherein the drain regions of at least two of the MOS transistors are electrically coupled to form an anode of the current regulating diode and the source regions of at least two of the MOS transistors are electrically coupled to form a cathode of the current regulating diode.

2. A semiconductor integrated device according to claim 1; wherein the at least one current regulating diode comprises a plurality of current regulating diodes, and the cathodes of at least two of the plurality of current regulating diodes are electrically coupled.

3. A semiconductor integrated device according to claim 2; wherein a source region forming the cathode of one of the at least two current regulating diodes forms a source region which is the cathode of another of the at least two current regulating diodes.

4. A semiconductor integrated device according to claim 1; further comprising an output terminal and an internal circuit, the internal circuit being electrically coupled to the output terminal via the current regulating diode.

5. A semiconductor integrated device according to claim 1; further comprising an input terminal and an internal circuit, the internal circuit being electrically coupled to the input terminal via the current regulating diode.

6. An electronic device comprising a light emitting diode and the semiconductor integrated device according to claim 1; wherein the current regulating diode is coupled to the light emitting diode.

7. A semiconductor integrated device according to claim 1; wherein each MOS transistor has a channel region disposed in the semiconductor substrate between the source region and the drain region, and wherein a width of the channel region of at least two of the MOS transistors is different.

8. A semiconductor integrated device according to claim 1; wherein each MOS transistor has a channel region disposed in the semiconductor substrate between the source region and the drain region, and wherein a width of the channel region of each of the MOS transistors has one of at least four different values and at least three of the at least four different values falls on a straight line having an exponential rate.

9. A semiconductor integrated device according to claim 1; further comprising a plurality of electrodes connected to the semiconductor substrate, and wherein the number of electrodes is smaller than the number of MOS transistors included in the plurality of MOS transistors.

10. A semiconductor integrated device according to claim 1; wherein at least one of the plurality of MOS transistors further comprises a first insulating film and a metal electrode formed over the source region, the first insulating film having a first aperture by which the source region is connected to the metal electrode, and a second insulating film formed over the gate and having a second aperture by which the gate is coupled to the metal electrode.

11. A semiconductor integrated device according to claim 10; wherein the at least one MOS transistor further comprises a third insulating film formed on the semiconductor substrate and having a third aperture on an impurity region which determines an electric potential of the substrate, the substrate being coupled to the metal electrode via the third aperture.

12. A semiconductor integrated device according to claim 1; further comprising a plurality of conductive lines for coupling the drain regions of at least two of the MOS transistors, each line having a narrowed portion having a width between about 3 and 5 µm, the narrowed portions being arranged substantially in parallel.

13. A semiconductor integrated device according to claim 1; further comprising a plurality of conductive lines for coupling the source regions of at least two of the MOS transistors, each line having a narrowed portion having a width between about 3 and 5 µm, the narrowed portions being arranged substantially in parallel.

14. A semiconductor integrated device according to claim 1; further comprising a plurality of conductive lines for coupling one of the at least two coupled drain regions and the at least two coupled source regions, wherein at least a portion of each of the lines is formed of polysilicon.

15. A semiconductor integrated device according to claim 1; further comprising a plurality of conductive lines for coupling one of the at least two coupled drain regions and the at least two coupled source regions, and a passivation film formed over each of the lines, wherein each passivation film is provided with an aperture portion.

16. A semiconductor integrated device according to claim 1; wherein the semiconductor substrate further comprises a first impurity region having a conductivity type opposite to that of a region of the substrate in which the plurality of MOS transistors are formed, the at least two coupled drain regions being electrically coupled to the first impurity region, and a second impurity region having the same conductivity type and a higher impurity concentration than the region of the semiconductor substrate in which the plurality of MOS transistors are formed, wherein a reverse breakdown voltage of a PN junction formed between the first impurity region and the second impurity region is smaller than a reverse breakdown voltage of a PN junction formed by the drain region and the substrate region of each of the MOS transistors.

17. A semiconductor integrated device according to claim 1; wherein an impurity concentration profile of at least one drain region which forms the anode has a step in a depthwise direction of the semiconductor substrate.

18. A semiconductor integrated device according to claim 1; wherein the gates of the MOS transistors comprise a gate insulating film formed over the semiconductor substrate and a gate electrode formed over the gate insulating film, and wherein the gate of at least one of the MOS transistors extends over the drain region thereof and is insulated from the drain region by the gate insulating film, and the gate insulating film has a greater thickness at a portion extending over the drain region than at another portion.

19. A semiconductor integrated device according to claim 1; wherein a threshold voltage of each of the depletion mode MOS transistors is smaller than −0.8 V.

20. A semiconductor integrated device according to claim 1; wherein the gates of the MOS transistors comprise a gate insulating film formed over the semiconductor substrate and a gate electrode formed over the gate insulating film, and a thickness of the gate insulating film is between about 350 and 600 Å.

21. A semiconductor integrated device according to claim 1; wherein the plurality of MOS transistors each has a channel region formed in the semiconductor substrate between the source region and the drain region, and wherein the channel region has a length greater than 8 µm.

22. A semiconductor integrated device according to claim 1; further comprising a first impurity region formed in the semiconductor substrate and having a higher concentration than another region of the semiconductor substrate in which the plurality of MOS transistors are formed, the first impurity region being formed below the region of the semiconductor substrate in which the MOS transistors are formed and extending to a back surface of the semiconductor substrate.

23. A semiconductor integrated device according to claim 1; further comprising a metal electrode layer formed on a back surface of the semiconductor substrate.

24. A semiconductor integrated device according to claim 1; wherein a metal-silicide is used as electrical coupling means.

25. A semiconductor integrated device according to claim 1; wherein the gates of the MOS transistors comprise a gate insulating film formed over the semiconductor substrate and a gate electrode formed over the gate insulating film, and wherein the gate insulating film comprises stacked layers of $SiO_2$, SiN, and $SiO_2$ formed on the semiconductor substrate.

26. A semiconductor integrated device comprising: a semiconductor substrate; a current regulating diode comprising a plurality of depletion mode MOS transistors formed in the semiconductor substrate, each MOS transistor including a gate, a source region, a drain region and a substrate region, the gate, the source region and the substrate region being electrically coupled; wherein the drain regions of at least two of the MOS transistors are electrically coupled and the source regions of at least two of the MOS transistors are electrically coupled; and a MOS switching element formed in the semiconductor substrate comprising a gate, a drain region, a source region and a substrate region, the source region of the MOS switching element being electrically coupled to the at least two coupled drains of the plurality of depletion mode MOS transistors; and wherein the drain region of the MOS switching element forms an anode of the current regulating diode and the at least two coupled source regions of the MOS transistors forms a cathode of the current regulating diode, and the gate of the MOS switching element is receptive of an external signal for switching on and off the MOS switching element.

27. A semiconductor integrated device according to claim 26; wherein at least one of the coupled drain regions of the depletion mode MOS transistors forms the source region of the MOS switching element.

28. A semiconductor integrated device according to claim 26; wherein at least one of the coupled source regions of the depletion mode MOS, transistors forms the drain region of the MOS switching element.

29. A semiconductor integrated device comprising: a semiconductor substrate; a current regulating diode comprising a plurality of depletion mode MOS transistors formed in the semiconductor substrate, each MOS transistor including a gate, a source region, a drain region and a substrate region, the gate and the source region being electrically coupled; wherein at least two drain regions of the MOS transistors are electrically coupled and at least two source regions of the MOS transistors are electrically coupled; and a MOS switching element formed in the semiconductor substrate and comprising a gate, a drain region, a source region and a substrate region, the drain region of the MOS switching element being electrically coupled to the source regions of the MOS transistors; wherein the at least two coupled drain regions of the MOS transistors form an anode of the current regulating diode and the source regions of the MOS transistors form a cathode of the current regulating diode, and the gate of the MOS switching element is receptive of an external signal for switching on and off the MOS switching element.

30. A semiconductor integrated device comprising: a current regulating diode comprising a plurality of MOS transistors formed in a semiconductor substrate, each MOS transistor including a gate, a source region, a drain region and a substrate region, the source region and the substrate region being electrically coupled, the drain regions of at least two of the MOS transistors being electrically coupled and the source regions of at least two of the MOS transistors being electrically coupled, the coupled drain regions forming an anode of the current regulating diode and the coupled source regions forming a cathode of the current regulating diode; and a constant voltage generating circuit producing a constant voltage output for application to the gates of the plurality of MOS transistors.

31. A semiconductor integrated device according to claim 30; wherein the constant voltage generating circuit includes means receptive of an external signal for selectively producing the constant voltage output to activate the current regulating diode.

32. A semiconductor integrated device according to claim 30; wherein the constant voltage generating circuit comprises a depletion mode MOS transistor and an enhancement mode MOS transistor.

33. A semiconductor integrated device comprising: a semiconductor substrate; and a current regulating diode comprising a plurality of MOS transistors formed in the semiconductor substrate, each MOS transistor including a gate, a source region, a drain region and a substrate region, the source region and the substrate region being electrically coupled, the drain regions of the MOS transistors being electrically coupled and the source regions of the MOS transistors being electrically coupled, the coupled drain regions forming an anode of the current regulating diode and the coupled source regions forming a cathode of the current regulating diode; and a constant voltage generating circuit producing a constant voltage output which is applied to the gates of at least two of the plurality of MOS transistors, and wherein the gates of the other ones of the plurality of MOS transistors are electrically coupled to the source regions thereof.

34. A semiconductor integrated device comprising: a semiconductor substrate; a first MOS transistor formed in the semiconductor substrate and having a gate, a source region, a drain region, and a substrate region, the drain region forming an anode and the source region forming a cathode; and a constant voltage generating circuit comprising a plurality of second MOS transistors formed in the semiconductor substrate, each second MOS transistor having a gate, a drain region, a source region and a substrate region, the gates of the second MOS transistors being electrically coupled to each other, the drain regions of at least two of the second MOS transistors being electrically coupled to each other and the source regions of each of the second MOS transistors being electrically coupled to each other; wherein a constant voltage output of the constant voltage generating circuit is applied to the gate of the first MOS transistor.

35. A semiconductor integrated device comprising: a MOS transistor having a gate, a source region, a drain region and a substrate region, the drain region forming an anode; at least one resistor element electrically coupled at one end to the source region, another end of the at least one coupled resistor element forming a cathode; a differential amplifier circuit having a first input terminal electrically coupled to the source region and an output terminal electrically coupled to the gate; and a constant voltage generating circuit for producing a constant voltage output which is input to a second input terminal of the differential amplifier circuit.

36. A semiconductor integrated device according to claim 35; wherein each of the at least one resistor elements has a different resistance value.

37. A semiconductor integrated device according to claim 35; wherein the at least one resistor element comprises a plurality of resistor elements each having a resistance selected from at least three different resistance values, wherein at least three of the at least three different resistance values falls on a straight line having an exponential rate.

38. A current regulating diode comprising: a semiconductor substrate; a plurality of first depletion mode MOS transistors formed in the semiconductor substrate, each first MOS transistor including a gate, a source region, a drain region and a substrate region, the gate, the source region and the substrate region being electrically coupled, the drain region of at least two of the first depletion mode MOS transistors being electrically coupled and the source region of at least two of the first depletion mode MOS transistors being electrically coupled, the coupled source regions forming a cathode; and a plurality of second depletion mode MOS transistors formed in the semiconductor substrate, each second MOS transistor including a gate, a source region, a drain region and a substrate region, the source region and the substrate region being electrically coupled, the drain regions of at least two of the second depletion mode MOS transistors being electrically coupled and the source regions of at least two of the second depletion mode MOS transistors being electrically coupled; wherein the coupled source regions of the second depletion mode MOS transistors are electrically coupled to the coupled drain regions of the first depletion mode MOS transistors, and the coupled drain regions of the second MOS transistors form an anode.

39. A semiconductor integrated device according to claim 38; wherein the drain regions of the first depletion MOS transistors form the source regions of the second depletion MOS transistors.

40. A semiconductor integrated device according to claim 38; wherein selected ones of the first and second depletion mode MOS transistors have a channel region disposed in the semiconductor substrate between the source region and the drain region and a channel length between the source region and the drain region is shorter than 8 µm.

41. A semiconductor integrated device comprising: a plurality of MOS transistors each including a gate, a drain region, a source region and a substrate region, the source region and the substrate region being electrically coupled, the drain regions of at least two of the MOS transistors being electrically coupled, the source regions of each of the MOS transistors being electrically coupled, and the gate of each of the MOS transistors being electrically coupled, wherein the coupled drain regions, the coupled source regions, and the coupled gates form a drain terminal, a source terminal and a gate terminal, respectively.

42. A method for producing a semiconductor integrated device which has a current regulating diode including a plurality of depletion type MOS transistors in a semiconductor substrate, each MOS transistor including a gate, a source region, a drain region and a substrate region, the gate, the source region and the substrate region being electrically coupled, the drain regions of at least two of the MOS transistors being electrically coupled, the source regions of at least two of the MOS transistors being electrically coupled, the coupled drain regions forming an anode of the current regulating diode and the coupled source regions forming a cathode of the current regulating diode, the method comprising the steps of: selecting a desired current value of the current regulating diode; measuring an actual current value of the current regulating diode; and cutting selected conductive lines between coupled drains or between coupled sources of the current regulating diode so as to obtain the desired current value.

43. A method for producing a semiconductor integrated device which has a plurality of MOS transistors each including a gate, a drain region, and a source region formed in a semiconductor substrate, the source regions and the substrate regions being electrically coupled to each other, the drain regions of at least two of the MOS transistors being electrically coupled, and the source regions of each of the MOS transistors being electrically coupled, the coupled drain regions, the coupled source regions, and the coupled gates forming a drain terminal, a source terminal and a gate terminal respectively, the method comprising the steps of: measuring a first current which flows in the drain terminal while applying a first voltage to the gate terminal and a second voltage to the drain terminal relative to an electric potential of the source terminal; measuring a second current which flows in the drain terminal while applying a third voltage to the gate terminal and the second voltage to the drain terminal relative to an electric potential of the source terminal; and cutting selected conductive lines between coupled drains or between coupled sources to obtain a predetermined current characteristic.

* * * * *